United States Patent
Miyachi

(10) Patent No.: US 6,750,950 B1
(45) Date of Patent: Jun. 15, 2004

(54) SCANNING EXPOSURE METHOD, SCANNING EXPOSURE APPARATUS AND MAKING METHOD FOR PRODUCING THE SAME, AND DEVICE AND METHOD FOR MANUFACTURING THE SAME

(75) Inventor: Takashi Miyachi, Saitama-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/720,789

(22) PCT Filed: Jun. 29, 1999

(86) PCT No.: PCT/JP99/03458

§ 371 (c)(1),
(2), (4) Date: Dec. 29, 2000

(87) PCT Pub. No.: WO00/01001

PCT Pub. Date: Jan. 6, 2000

(30) Foreign Application Priority Data

Jun. 29, 1998 (JP) .......................................... 10-197977

(51) Int. Cl.$^7$ .......................... G03B 27/52; G03B 27/42
(52) U.S. Cl. .......................................... 355/55; 355/53
(58) Field of Search .............................. 355/52, 53, 55, 355/67–71; 356/399–401; 250/548

(56) References Cited

U.S. PATENT DOCUMENTS

| | | | |
|---|---|---|---|
| 5,412,214 A | * 5/1995 | Suzuki et al. | 250/548 |
| 5,654,553 A | * 8/1997 | Kawakubo et al. | 250/548 |
| 5,737,063 A | 4/1998 | Miyachi | 355/53 |
| H1774 H | 1/1999 | Miyachi | 355/67 |
| 5,920,398 A | 7/1999 | Iwanaga et al. | |
| 6,117,598 A | * 9/2000 | Imai | 430/22 |
| 6,118,515 A | 9/2000 | Wakamoto et al. | 355/53 |
| 6,277,533 B1 | * 8/2001 | Wakamoto et al. | 430/30 |

FOREIGN PATENT DOCUMENTS

| | | | |
|---|---|---|---|
| EP | 0 867 771 | | 9/1998 |
| JP | 9-15872 | | 1/1997 |
| JP | 9-17717 | | 1/1997 |
| JP | 9306823 | * | 11/1997 |
| JP | 9-306823 | | 11/1997 |

* cited by examiner

Primary Examiner—Henry Hung Nguyen
(74) Attorney, Agent, or Firm—Oblon, Spivak, McClelland, Maier & Neustadt, P.C.

(57) ABSTRACT

A main control system determines a mode of a focusing control based on both data representing the surface condition of a divided area and data for a shape of an illumination area on a wafer. Then, the main control system controls actuators based on detection results from a focus sensor, and performs the focusing control of a substrate stage for holding the wafer in respect to a projection optical system. Simultaneously with the focusing control, the main control system controls a wafer stage driving block to control the synchronous movement of a reticle stage and substrate table. Thereby a pattern formed on a reticle is transferred onto the divided area on the wafer via the projection optical system. Not premising a high focusing control driving practicability, the pattern is transferred onto the substrate without serious deterioration of imaging performance.

24 Claims, 11 Drawing Sheets

SCANNING EXPOSURE METHOD, SCANNING EXPOSURE APPARATUS AND MAKING METHOD FOR PRODUCING THE SAME, AND DEVICE AND METHOD FOR MANUFACTURING THE SAME

TECHNICAL FIELD

The present invention relates to a scanning exposure method, a scanning exposure apparatus and making method thereof, and a device and a device manufacturing method. More particularly, the present invention relates to a scanning exposure method to be employed in a lithographic process for manufacturing a semiconductor device, a liquid crystal display device and so forth; a scanning exposure apparatus on which the scanning exposure method is applied and a making method thereof; as well as a device which is manufactured by using the scanning exposure apparatus and a manufacturing method thereof.

BACKGROUND ART

Conventionally, in a lithographic process for manufacturing a semiconductor device, liquid crystal display device and so forth, an exposure apparatus has been used. In such an exposure apparatus, patterns formed on a mask or reticle (to be genetically referred to as a "reticle" hereinafter) are transferred through a projection optical system onto a substrate such as a wafer or glass plate (to be referred to as a "substrate or wafer" herein after, as needed) coated with a resist or the like. In general, a projection optical system with a large numerical aperture (to be referred to as "N.A.", hereinafter) and a shallow focal depth is used in the projection exposure apparatus. The mechanism to bring the substrate surface to a proximate level of an imaging plane in the projection optical system is necessary for the projection exposure apparatus for transferring fine circuit patterns onto a substrate with high resolution. Therefore, the exposure apparatus has a focusing system for brining the substrate surface to the range of the focal depth of the projection optical system. The system is composed of the focus/leveling detecting mechanism and the adjusting mechanism, and the system is referred to as the "Z-leveling stage" herein after. The focus/leveling detecting mechanism detects the position and tilt of the substrate surface in optical axis direction of the projection optical system (that is, Z-direction), and the adjusting mechanism adjusts the position and the posture of the substrate surface by using the detected position and the tilt of the surface in Z-direction.

On the contrary, semiconductor chip devices recently tend to be large-sized, and there is needs to transfer larger patterns onto the substrate by the projection exposure. For satisfying such needs, so-called step and scan type scanning exposure apparatus is practically used. In the apparatus, a reticle and the substrate are synchronously scanned against the projection optical system, shot areas are exposed over the effective illumination area of the projection optical system. In the scanning type exposure apparatus, in order to expose a shot area on the substrate surface, the shot area, i.e. substrate, and the reticle must be moved synchronously with the fixed velocity commensurate to the predetermined exposure dose amount, while the substrate and the reticle are positioning. Therefore, the following procedures are included: the stage on which the substrate is loaded (XY stage) is allowed to run when the shot area is far from exposure area on the substrate surface, on which exposure light is illuminated when the light is passed through the projection optical system; the stage loading the substrate and the stage loading the reticle are synchronized; and then, the exposure is begun at the time that the shot area on the substrate is reached the exposure area.

As a part of the procedure, the positional information in Z-direction and the tilt information in the synchronized moving direction and the unsynchronized moving direction (i.e., perpendicular to the synchronized direction) are detected for the substrate surface area in the exposure area. By using this detection result, the focusing operation is performed for the substrate surface area in the exposure area. In the focusing operation, the focusing operation for focusing in the optical axis direction of the projection optical system (Z-direction) and the leveling operation for focusing in tilt direction around X-axis and Y-axis are simultaneously performed. Thereby, the difference between the expose plane on the substrate and the image plane of the projection optical system becomes minimal. When the synchronous moving direction is Y-direction, the tilt for the synchronous moving direction is represented as the rotational amount around X-axis, and that in the asynchronous moving direction is represented as the rotational amount around Y-axis.

In the step and scan type scanning exposure apparatus, since the substrate to be exposed is moved during the exposure, the control is repeated successively so that the image plane of the projection optical system closes to the exposure plane on the surface of the photosensitive substrate. Accordingly, in the typical structure of the Z-leveling stage in which the driving mechanism is arranged periphery of the substrate, most of the driving load in the leveling stage is caused by the leveling operation.

In such scanning exposure apparatuses, the slit shape of the exposure area on which the exposure light passed through the projection optical system is generally In the shape of the exposure area, the length in the synchronous moving direction (for example, Y-direction) is shorter than that in the asynchronous moving direction (for example, X-direction). Based on the shape of the exposure area, focus detection points are arranged inside of the exposure area (and outside of it, if necessary). At that time, the length that is used as the base line for calculating the tilt components in the synchronous moving direction is shorter than that in asynchronous direction. Therefore, the leveling action for the asynchronous direction greatly contributes to the driving load on the Z-leveling stage.

That is, in the step and scan type scanning apparatus, most of the driving practicability of the Z-leveling stage is spent to the leveling action in the scanning direction.

Integrated circuit patterns formed on the substrate often have different number of starts, and it causes the increase of driving load for the Z-leveling stage in the leveling action for the synchronous moving direction. In the substrate having such different number of stairs, the stair pattern formed by the different number of stairs sometimes has the periodical repeating components. Furthermore, the distribution state of the period varies depending on, for example, the application or characteristics of the integrated circuit pattern. When the ratio of the short periodical components is high, the driving load for the leveling action in the synchronous moving direction. Therefore, the driving practicability of Z-leveling stage should be high must, and it causes the structure of Z-leveling stage to be complicate and large scaled.

When the performance of z-leveling stage does not fulfill the required performance for following-up the leveling in the synchronous direction, the adjustment of the leveling is insufficient. Furthermore, when 100% of the performance of Z-leveling stage is applied for following-up the leveling caused by the difference number of the stairs in the synchronous moving direction, it is impossible to correct the figure of the substrate except the difference (for example, warpage or swell in the raw substrate). Thereby nonlinear area is generated which causes to loose control, and the transfer of the pattern can be affected by more serious effect such as awful deterioration for imaging and so forth.

The present invention has been made in consideration of the above-mentioned situation. The first object of the present is to provide the exposure method for transferring a pattern without extreme deterioration of the imaging performance.

The second object of the present invention is to provide the exposure apparatus for transferring a pattern without extreme deterioration of the imaging performance.

The third object of the present invention is to provide the device on which fine patterns are precisely formed.

DISCLOSURE OF INVENTION

As mentioned above, in the scanning exposure by the so-called step and scan member, high focusing driving power is necessary as the premise for accurate focusing control at respective time point during exposure by followed-up the synchronous moving. According to the knowledge from the study conducted by the present inventors, the exposure area to be illuminated by the exponent light generally has a certain slit with in the synchronous moving direction. Therefore, when the period of the convex and concave in the divided area on the substrate surface having the difference of a stair is shorter than the slit width, the imaging performance is not improved by amending the leveling in the synchronous moving direction to follow-up the difference of the stair.

That is, when the repeating period of the difference on the substrate is shorter than the slit width, the defocus amount in the part around the center is run into almost 0 by the follow-up of the leveling in the synchronous moving direction. However, around of the edge of the exposure area is exposed under the condition that rather large defocus amount resides (see FIG. 9A). In this case, as shown in Japan laid-open No. S63-64037 and its corresponding U.S. Pat. No. 4,869,999, the superimposed focal exposure, in which the decline of the focal depth is amended by the superimposing projected images at different focus positions, is performed. In the superimposed focal exposure, the exposure is performed with three conditions of the positive defocus amount/no defocus amount/negative defocus amount. On the contrary, when the follow-up of the leveling in the synchronous moving direction is not used, the defocus amount in the part around the center of the exposure area is almost 0. Except the part around the center of the exposure area is exposed under the condition in which the defocus amount in proportion to the distance from the center remains (see, FIG. 9B). In this case, as shown in Japan laid-open No. H5-13305 and its corresponding U.S. Pat. No. 5,343,270, the continuous superimposed exposure from the positive defocus amount to the negative one is performed.

Since various parameters such as the photoresist agents and so forth are related, it is case by case that either one give results that are most desirable in brief. However, when the leveling is followed-up, Z-leveling stage is applied more load. Therefore, on the design of the apparatus, Z-leveling stage must be designed to have larger margin in its performance. Being estimated shorter the period of the difference of the stair in the substrate, being clearer the tendency.

The present invention is completed based on the above description. In the first aspect of the present invention, the present invention is the scanning exposure method for transferring a pattern formed on a mask to a divided area on a substrate through a projection optical system, while said mask and said substrate are synchronously moved, comprising the steps of: deciding a focusing control mode to be used when said pattern is transferred onto the divided area in a plurality of focusing control modes, depending on a surface condition of the divided area; transferring the pattern formed on the mask onto the divided area and performing said focusing control in the decided mode.

With this, the mode of the focusing control is decided, depending on the surface condition of the divided area. Then, the pattern formed on the mask is transferred onto the divided area, performing the focusing control with the properly adjusted mode Accordingly, the properly adjusted focusing control action might be performed, depending on the surface condition of the divided area in which the warpage or swell of the raw substrate is reflected. Therefore, the pattern formed on the mask is transferred onto the substrate with no serious deterioration of the imaging performance or no premise for the high driving practicability for the focusing control (to be referred to as the "focusing control driving power").

The focusing control might include the focus position control that controls the position of the substrate in the optical axis direction of the projection optical system. In addition, it might include the leveling control that controls the tilt of the substrate to the plane perpendicular to the optical axis direction of the projection optical system. The leveling control might include the tilt control of the substrate in the synchronous moving direction and the tilt control of the substrate in the direction perpendicular to the synchronous moving direction in the plane perpendicular to the optical axis direction of the projection optical system.

In the first scanning exposure direction, the focusing control mode to be used when said pattern is transferred might be decided, further considering a shape of an illumination area on said substrate. Alternatively, the focusing control mode can be decided, prior to the transfer operation for the divided area. In this case, the focusing control mode for the substrate is decided depending on the relation between the surface condition of the divided area and the shape of the illumination area (the exposure area). Then, the pattern formed on the mask can be transferred onto the divided area, performing the focusing control in the properly adjusted mode.

The leveling control can be done or not done by taking notice of that in the synchronous moving direction, in which it is predicted that the driving load becomes the highest when the focusing control is performed. That is, the plurality of focusing control mode include: the first mode in which the tilt control of the substrate is performed in the synchronous moving direction by following-up the synchronous moving; and a second mode in which tilt control of the substrate is not performed in the synchronous moving direction by following-up the synchronous moving.

Furthermore, the surface condition of the divided area can be represented as a spatial frequency distribution along the synchronous moving direction of the substrate, on which a repeating unit area of the pattern to be transferred having convex and concave along the optical axis direction of the projection optical system, wherein the repeating unit area is placed in said divided area; and the shape of the illumination area is represented as a slit width of the illumination area in the synchronous moving direction of the substrate. Then, the substrate can be controlled by the focusing control in the first mode or the second mode. The first mode is used, when a predominant wavelength is equal to or longer than the length depending on the slit width, wherein the predominant wavelength is corresponding to a predominant frequency, which has maximum amplitude in said spatial frequency distribution. The second mode is used, when a predominant wavelength is shorter than the length depending on the slit width. In this case, the leveling control in the synchronous direction can be the suitable control that neither has serious deterioration of the imaging performance nor requires high focusing control power, when the high driving load is supposed to be necessary for the focusing control.

The length depending on the slit width can be the slit width.

In the first scanning exposure method, for example, the surface condition of the divided area can be obtained by calculating based on the lithography process for the substrate, or can be measured prior to the transfer of the pattern formed on the mask onto the divided area.

Such a prior measurement can be conducted in every lot of the substrate, prior to the transfer of the pattern. Alternatively, it can be done in every exposure process, prior to the transfer of the pattern. Furthermore, when a plurality of the divided areas are arranged on the substrate, the prior measurement for the surface condition of the substrate can be representatively conducted for one of the divided areas. In the above-mentioned cases, the time to be spent the prior measurement can be shorten without the large transfer error of the pattern, compared to perform the prior measurement for the surface condition of every divided area.

In the first scanning exposure method, the focusing control might include a focus position control that controls a position of said substrate in an optical axis direction of said projection optical system; on a decision that said focus position control can not follow-up said synchronous moving, a control, wherein a position of the substrate in an optical axis direction of said projection optical system just prior to the decision is maintained, is performed. In this case, the pattern formed on the mask is transferred onto the substrate with no serious deterioration of the imaging performance or no premise for the high driving power for the focusing control.

In the first scanning exposure method, the focusing control can include a tilt control of the substrate in the synchronous moving direction; on a decision that the tilt control can not follow-up said synchronous moving, a control, wherein a position of the substrate in an optical axis direction of said projection optical system just prior to the decision is maintained, is performed. When it is decided that the synchronous moving can be followed-up the tilt control, the tilt control is performed by following the synchronous moving. In this case, the leveling control in the synchronous direction can be the suitable control that neither has serious deterioration of the imaging performance nor requires high focusing control power, when the high driving load is supposed to be necessary for focusing control.

Alternatively, in the first scanning exposure method, the said focusing control includes a tilt control that controls the tilt of the substrate, wherein the substrate is moved in a plane perpendicular to the optical axis direction of the projection optical system and the tilt of the substrate in a direction perpendicular to the synchronous moving direction is controlled; on a decision that the tilt control can not follow-up said synchronous moving, a control, wherein a position of the substrate in an optical axis direction of said projection optical system just prior to the decision is maintained, is performed. When it is decided that the synchronous moving can be followed-up the tilt control, the tilt control is performed by following the synchronous moving. In this case, the leveling control in the synchronous direction can be the suitable control that neither has serious deterioration of the imaging performance nor requires high focusing control power, when the high driving load is supposed to be necessary for the focusing control.

In the second aspect of the present invention, the present invention is the second scanning exposure method for exposing the substrate, while moving the substrate in a predetermined direction to an exposure beam which passes through the projection optical system, and detecting a position information of the substrate surface in the optical axis direction of the projection optical system comprising the steps of: measuring convex and concave information on the substrate surface, while moving the substrate in the predetermined direction in a condition that the substrate is not exposed; and deciding whether a tilt of the substrate in the predetermined direction is adjusted or not, during an exposure of the substrate, by using said a convex and concave information measured, wherein based on said position information detected.

With this, while the substrate is moved into the predetermined direction with no exposure, the information of the concave and convex on the substrate surface is measured. Based on the detection result of the concave and convex, it is decided whether a tilt of the substrate in the predetermined direction, which is obtained from the position information of the substrate surface in the optical axis direction of the projection optical system, is adjusted or not. Accordingly, the pattern formed on the mask might be transferred onto the substrate, performing the suitable focusing control depending on the surface condition of the divided area.

In the second scanning exposure method of the present invention, it can be decided whether a tilt of the substrate in the predetermined direction is adjusted or not during an exposure of the substrate so that a deterioration of positioning accuracy of the image plane of said projection system and the substrate surface is prevented. In this case, the properly adjusted focusing control action might be performed, depending on the surface condition of the divided area in which the warpage or swell of the raw substrate is reflected. Therefore, the pattern formed on the mask is transferred onto the substrate with no serious deterioration of the imaging performance or no premise for the high driving power for the focusing control.

In the third aspect of the present invention, the present invention is the scanning exposure apparatus which is used to transfer the pattern formed on the mask onto the divided area on the substrate, through a projection optical system, moving the mask and the substrate, comprising: a mask stage for holding the mask; a substrate stage for holding the substrate; the first detecting system for detecting a position for at least one of detection point in an optical axis direction of the projection optical system, in a illumination area on said substrate surface; the first driving system for driving the mask stage and the substrate stage in plane perpendicular to the optical axis direction of the projection optical system; the second driving system for driving the substrate stage to at least one of the optical axis direction of the projection detecting system and the tilt direction; a memory unit for storing a data representing the substrate condition of the divided area; and a control system for synchronously moving the mask stage and the substrate stage by controlling the first driving system, while performing said focusing control by controlling the second driving system based on a result from the first detecting system, wherein a focusing control mode to be used in the transfer a pattern onto said divided area is decided from a plurality of focusing control modes based on the data representing the substrate surface of the divided area.

According to this, the control system decides a focusing control mode based on a relation between a data representing the substrate surface of the divided area and a data for the shape of the illumination area. Then, the control system controls the second driving system in the decided focusing control mode, based on the detection result from the first detecting system to drive the substrate stage for holding the substrate into the optical axis direction of the projection optical system, to performs the focusing control. In company with the focusing control, the control system controls the first driving system to perform synchronous moving control of the mask stage and the substrate stage; thereby the pattern formed on the mask is transferred onto the divided area on the substrate through the projection optical system. Accordingly, the pattern is transferred by using the present exposure method, it can be transferred without serious deterioration of the imaging performance, while the focus control is performed by using the simple structure which does not promise the high focusing driving practicability. Alternatively, the control system can be structured so that the focusing control mode is decided, prior to the transfer operation for the divided area.

In the focusing control, the structure might be used; wherein the control system performs the focus position control, which control is the second driving system by using the detection result from the first detecting system according to the decided focusing control mode, and it includes the focusing control for controlling the substrate position in the optical axis direction of the projection optical system. The other structure might be used; wherein the first detecting system for detecting the position of the multiple detection points, and the control system for performing the focusing control including the leveling control. In the first detecting system, the multiple detection points include at least two detection points in the illumination area on the substrate, and the positions of them in the optical axis direction of the projection optical system are detected. The leveling control controls the second driving system by using the detection result from the first detecting system according to the decided focusing control mode, and it controls the tilt of the substrate to the plane perpendicular to the optical axis direction of the optical projection system.

In the leveling control, the structure might be used: wherein the first detecting system detects the positions of the multiple detection points in the illumination area on the substrate surface in the optical axis direction of the projection optical system; and the multiple detection points include at least two points, of which positions in the synchronous moving direction are different. The control system controls the second driving system by using the detection result from the first detecting system according to the decided focusing control mode to perform leveling control including the tilt control of the substrate in the synchronous moving direction. Furthermore, another structure might be used; wherein the first detecting system detects the positions of the multiple detection points in the illumination area on the substrate surface in the optical axis direction of the projection optical system; and the multiple detection points include at least two points, of which positions in the direction perpendicular to the synchronous moving direction are different. The control system controls the second driving system by using the detection result from the first detecting system according to the decided focusing control mode to perform the leveling control including the tilt control of the substrate in the plane perpendicular to the synchronous moving direction.

In the scanning exposure apparatus of the present invention, the above-mentioned control system might be the structure for deciding the focusing control mode based on the relation between the data representing the surface condition of the divided area and that for the shape of the illumination area. In this case, since the focusing control mode is decided, further considering the shape of the illumination area on the substrate surface, the suitable focusing mode is precisely decided.

The plurality of focusing control modes can be include: the first mode for controlling a tilt of the substrate in the synchronous moving direction by following-up the synchronous moving of the substrate; and the second mode for not controlling the tilt of the substrate in the synchronous moving direction by following-up the synchronous moving of said substrate. Furthermore, the following structure can be used: wherein, the data representing the substrate surface on the divided area is a predominant wavelength corresponding to a predominant frequency, of which amplitude is maximal in a spatial frequency distribution. The distribution shows a repeating unit area for the pattern to be transferred in the divided area having a convex and concave on the substrate. Wherein, the convex and concave are in the synchronous direction. The data for the shape of the illumination area is a slit width in the synchronous moving direction of the illumination area; and the control system performs the focusing control of the substrate in the first mode when the predominant wavelength is not shorter than the slit width, and it performs the focusing control of the substrate in the second mode when the predominant wavelength is shorter than the slit width.

The scanning exposure apparatus can be further comprise the second detecting system which detects a tilt of the substrate stage in the synchronous moving direction to a virtual plane perpendicular to the optical axis direction of the projection optical system and in a direction perpendicular to the said synchronous moving direction; and the main control system can perform the focusing control based on detection results from the first and second detecting systems. With this, when the suitable focusing control can be performed by using the detection result from the first detecting system, the suitable focusing control can be performed by further considering the detection result from the second detecting system.

The following structure can be used: when a plurality of focusing control modes further includes a third mode, which maintains the surface of the substrate shape in parallel with the virtual plane based on the detection result from the second detecting system. The exposure apparatus further comprises the calculating operation unit, which acquires the detection result data from the first detecting system during the synchronous moving under the focusing control in the third mode and then obtain the surface condition of the divided area, based on the detection result data. In this case, adding to the general exposure processing, the measurement processing for the surface condition of the divided area prior to the scanning exposure by itself. Alternatively, the calculating operation unit employs the structure; wherein the calculating operation unit calculates the spatial frequency distribution formed by the concave and convex along the synchronous moving direction of the substrate, and the calculating operation units obtains a predominant wavelength corresponding to a predominant frequency which becomes maximum in the spatial frequency distribution to store in the memory unit, and then an calculating operation system for acquiring a detection result data by using the first detecting system during said synchronous moving under the focusing control in the third mode, and it obtains the surface condition of the divided area based on the detection result data. Wherein, the concave and convex in the optical axis direction of the projection optical system are formed in the area for repeating unit of a pattern to be transferred in the divided area.

In the fourth aspect of the present invention, the present invention is a making method of a scanning exposure apparatus for transferring the pattern formed on the mask through a projection optical system, while a mask and a substrate move synchronously, comprising the steps of: providing a mask stage for holding the mask; providing a substrate stage for holding the substrate; providing a first detecting system for detecting a position of the projection optical system in an optical axis direction in at least one detection point in said illumination area on the substrate surface; providing a first driving system for driving the mask stage and the substrate stage in a plane which is perpendicular to the optical axis direction of the projection optical system; providing a second driving system for driving the substrate stage in at least one direction of the optical axis direction of the projection optical system or a tilt direction; providing a memory unit for memorizing a data representing a surface condition of the divided area; and providing a control system for moving the mask stage and the substrate stage synchronously by controlling the first driving system, performing the focusing control by controlling the second driving system based on a result from the first detecting system. Alternatively, the control system can use the structure in which the focusing control mode is decided, prior to the transfer operation for the divided area.

With this, the exposure apparatus of the present embodiment might be produced; wherein, the above-mentioned mask stage, the substrate stage, the first detecting system, the first driving system, the second driving system, the memory unit, control system, and other blocks and units, and are connected electrically, mechanically and optically to assemble the apparatus. After that, the apparatus is totally adjusted (electrical adjustment or inspection of the operation).

The making method of the scanning type exposure apparatus of the present invention can further comprise the step of providing the second detecting system for detecting a tilt of the substrate stage in the synchronous moving direction to a virtual plane perpendicular to the optical axis direction of the projection optical system and in a direction perpendicular to the synchronous moving direction. In this case, the apparatus for performing the suitable focusing control can be made, which performs the suitable focusing control by considering the detection result from the second detecting system, even when the suitable focusing control can not be performed based on the sole detection result from the first detection system.

The making method of the scanning type exposure apparatus of the present invention for providing the second detecting system might further comprise the step of providing a calculating operation system for acquiring a detection result data from the first detecting system during the synchronous moving under the focusing control, which maintains the substrate stage surface to be substantially parallel to the virtual plane, based on the detection result from the second detecting system to obtain the surface condition of the divided area.

Furthermore, in the lithography step, the device comprising fine patterns may be manufactured by transferring a predetermined pattern to the divided area formed on the substrate by using the apparatus of the present invention. At that time, the exposure method in which the first or the second position detection method described above is used. Accordingly, the present invention is the device manufactured by using the exposure apparatus of the present invention in another viewpoint, and also it is the manufacturing method of device by using the exposure method of the present invention to transfer the predetermined pattern onto the substrate.

BEST MODE FOR CARRYING OUT THE INVENTION

An exposure method and exposure apparatus according to an embodiment of the present invention will be described below with reference to FIGS. 1 to 11.

Figure 1:
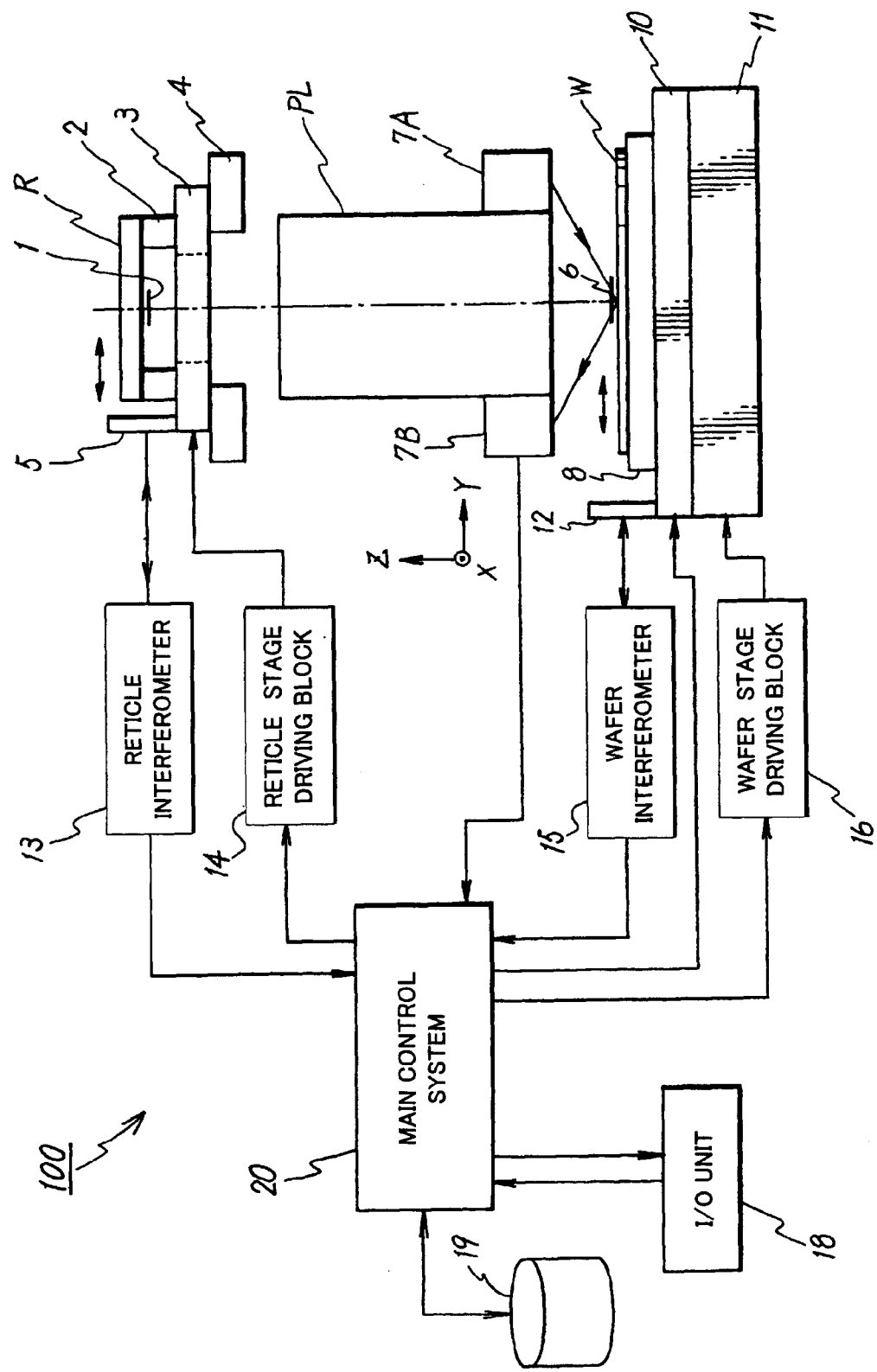
FIG. 1 is a view showing the schematic arrangement of an exposure apparatus according to one embodiment.

FIG. 1 shows the schematic arrangement of an exposure apparatus 100 according to one embodiment of the present invention.

The exposure apparatus 100 comprises: the reticle stage 3 serving as a mask stage for holding the reticle R as a mask; a projection optical system PL; the substrate table 10 as a substrate stage for holding the wafer W as a substrate; X-Y stage 11 for loading the substrate table 10; the focus sensors 7A and 7B as the first detecting system; the control system for controlling thereof, and so forth.

The reticle R is fixed on the reticle stage 3 through the reticle holder 2. The reticle stage 3 is driven in a synchronous moving direction (the scan direction is Y-direction shown in FIG. 1) along a guide face of the reticle stage guide 4 by the reticle stage driving block 14 which uses electromagnetic force such as a linear motor and so forth. On the reticle stage 3, the moving mirror 5 is provided in the one terminal of its moving direction. The reticle interferometer is arranged for emitting laser beams to the moving mirror 15 to receive their reflected lights and measuring the position of the reticle stage 3 in the Y-direction and the yawing amount. The reticle interferometer 13 can measure the position of the reticle stage in X-direction by using the moving mirror provided on the reticle stage 3 which is not shown in Figs. Various measured by the reticle interferometer 13 are inputted into the main control system 20, which controls the position and the velocity of the reticle stage 3 through the reticle driving block based on the value.

The illumination area 1 on the reticle R is illuminated almost evenly by the illumination lights from the illumination system, which is not shown. The projection image is formed on the exposure area 6 as the illumination area formed on the wafer W through the projection optical system PL.

The illumination system includes, for example, the light unit, a shutter, the secondary light source forming optical system, a beam splitter, a condenser lens system, a reticle blind, and an image lens system, which are not shown in FIG. 1. The respective components of the illumination system are disclosed, for example, disclosed in the publication of Japanese unexamined patent application (refer to as "Japan laid-open", hereinafter) No. H9-320956. The disclosure described in the above is fully incorporated by reference herein. As the light source unit, followings are used: KrF excimer laser beam (wavelength=248 nm), ArF excimer laser beam (wavelength=193 nm), $F_2$ laser beam (wavelength=157 nm), $Kr_2$ (krypton dimer) laser beam (wavelength=146 nm), $Ar_2$ (argon dimer) laser beam (wavelength=126 nm), high harmonic generation devices such as copper vapor laser or YAG laser harmonics, an ultra-high pressure mercury vapor lamp (e.g., g-line or i-line), or the like. Alternatively, instead of the light, which is emitted from the above-mentioned light source, beam such as charged electron x-ray and electron beam might be used.

Figure 2:
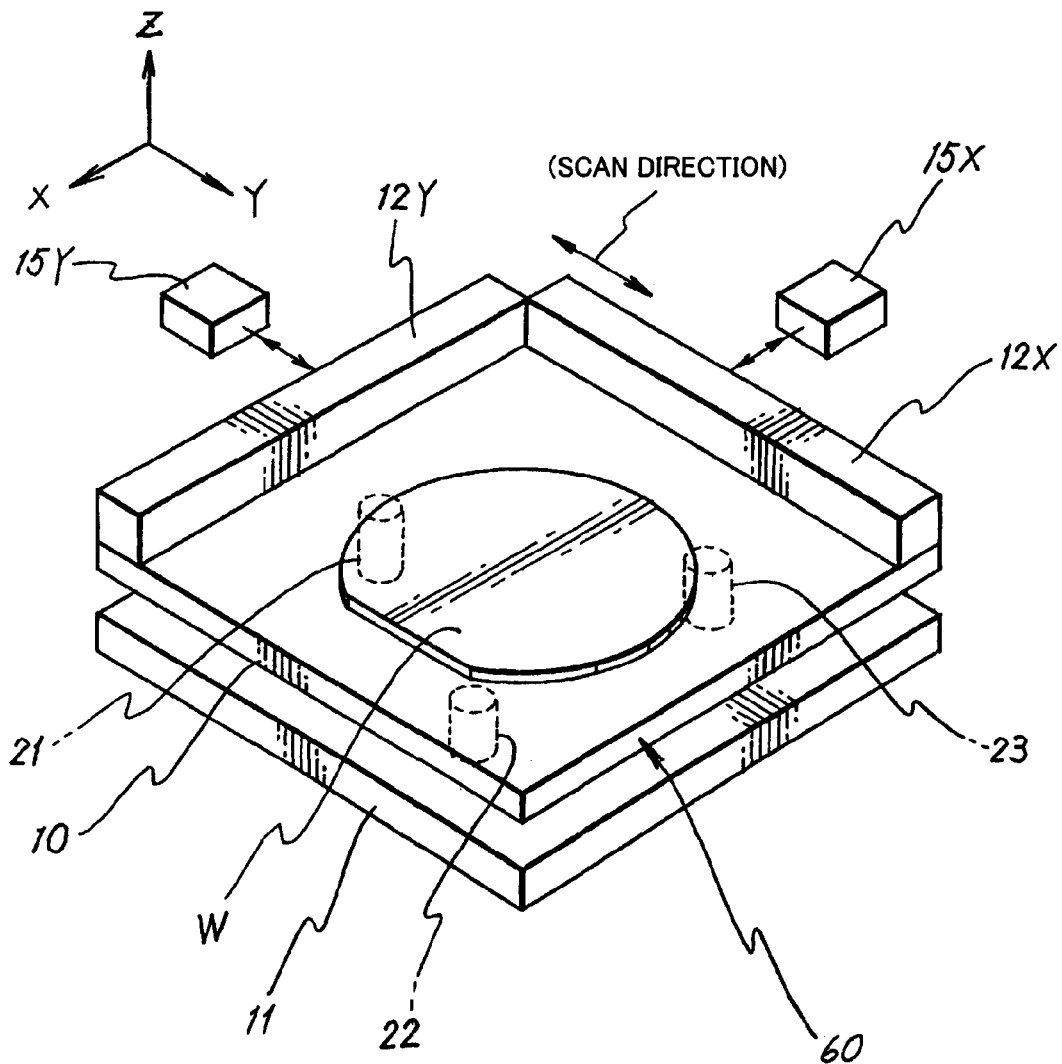
FIG. 2 is a view for explaining the substrate table and its driving mechanism of the apparatus in FIG. 1.

The wafer holder 8 is fixed on the substrate table 10, for example, by vacuum chucking which is not shown. The substrate table 10 is supported on the X-Y stage by three shafts, 21, 22 and 23, all of which are the Z-position driving blocks as the second driving system, as shown in FIG. 2. These the Z-position driving blocks 21, 22 and 23 are composed of three actuators, 21A, 22A and 23A and three encoders, 21B, 22B and 23B (see FIG. 5). The Z-position driving blocks drives the respective supporting shafts of the blocks structured in the undersurface of the substrate table 10 in the optical axis direction of the projection optical system PL (Z-direction). The encoders detect the position of the respective position driving blocks in Z-direction. The structure of the Z-position driving block is disclosed, for example, Japan laid-open No. H9-82636 and its correspondent, U.S. Pat. No. 5,737,063 The disclosure described in the above is fully incorporated by reference herein, as far as the law of the countries designated in a request or elected in a demand for the application filed in the country of origin permits them.

In the present embodiment, the Z-leveling stage 60 as the adjusting means for adjusting both the position in the optical axis direction (Z-direction position) and the tilt of the wafer W surface is composed of the substrate table 10 and three actuators 21A, 22A and 23A (see FIG. 2).

Back to FIG. 1, the X-Y stage on which the substrate table is fixed is driven by the wafer stage driving block 16 which utilize electromagnetic force such as the linear motor to move wafer in X-Y two dimensional direction. The first driving system is composed of the reticle stage driving block 14 and the wafer stage driving block 16. As shown in FIG. 2, in one end of the substrate table 10 in X-axis direction, the moving mirror 12 X is placed along the end, i.e., Y-axis. The wafer interferometer for X-axis 15X is arranged opposite to the moving mirror 12X. Similarly to this, in one end of the substrate table 10 in Y-axis direction, the moving mirror 12 Y is placed along the end, i.e., X-axis. The wafer interferometer for Y-axis 15Y is arranged opposite to the moving mirror 12Y. X-Y two dimensional position of the substrate table 10 is measured by the waver interferometers 15X and 15Y. In FIG. 1, the moving mirrors 12X and 12Y are represented as the moving mirror 12, and the wafer interferometers 15X and 15Y are represented as the wafer interferometer. The measured value is input into the main control system 20, which controls the position and the velocity of the X-Y stage 11 by using the measured value through the wafer stage driving block 16. In the exposure the wafer W, the main control system 20 synchronously controls the reticle stage 3 and the X-Y stage 11 based on the measured value derived from the reticle interferometer 13 and the wafer interferometer 15.

Figure 3A:
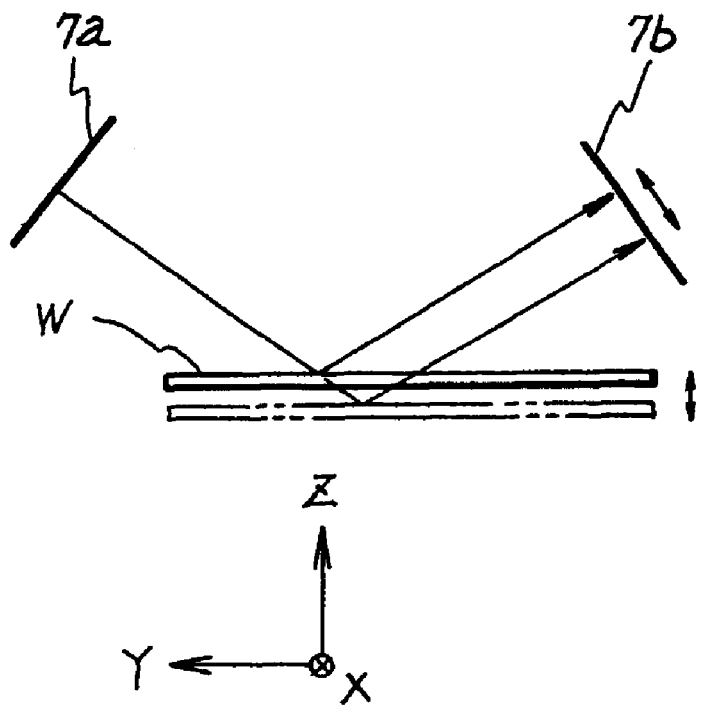
FIGS. 3A and 3B are perspective views for explaining the principle of focus shown in FIG. 1.
Figure 3B:
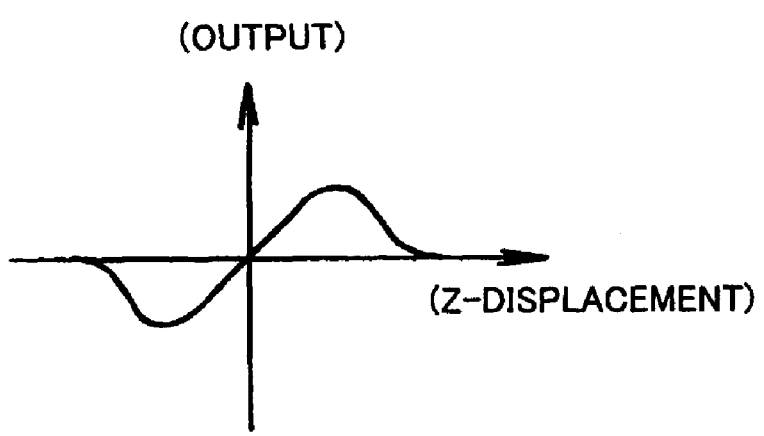
Figure 4:
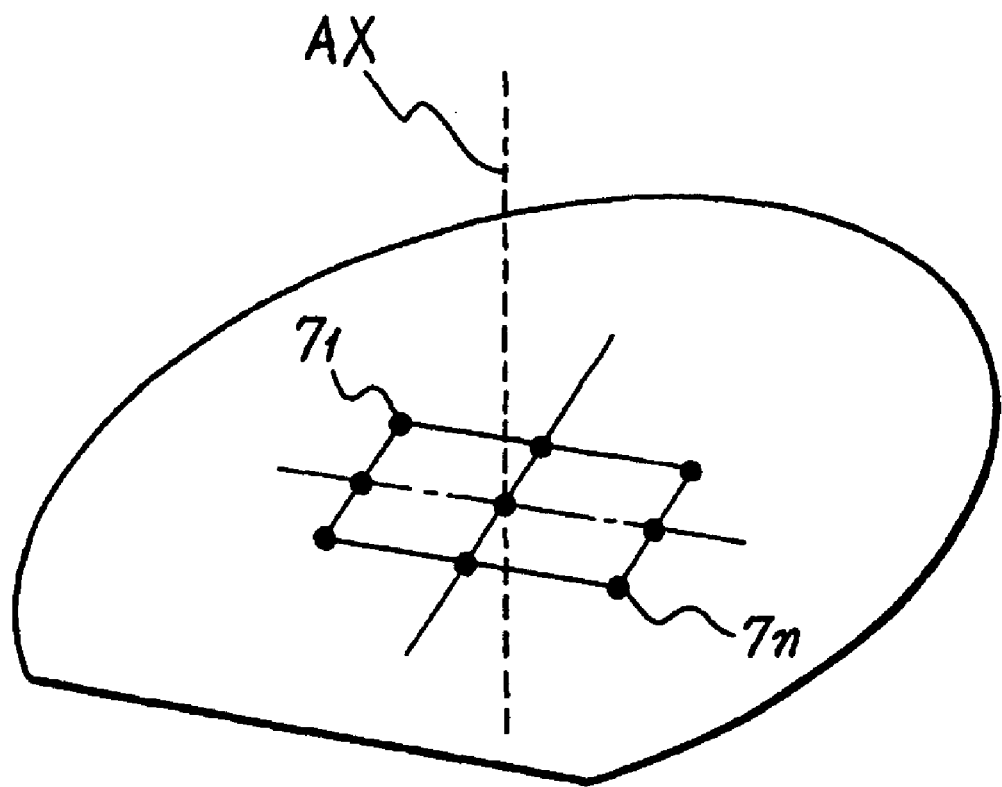
FIG. 4 is a view showing respective sensor, which structures the focus sensor in FIG. 1.

The above mentioned focus sensors 7A and 7B (to be generally referred to as the "focus sensor 7") as composed of the emitting and/or transmitting light system 7A and the light sensing system, and they detect the position in Z-direction of the wafer W surface. In FIG. 3, the detection principal in the focus sensor 7 is shown. As shown in FIG. 3A, when the light beam is emitted from the emitting and/or transmitting light system 7A, the incident position of the reflection light on the wafer W surface is changed on the light sensing plane of the light sensing system 7B depending on the position of the wafer W surface in Z-direction. Corresponding to the change, S-shaped curve signal as shown in FIG. 3B is output from the light sensing system 7B, and the position of the wafer W surface in Z-direction is detected based on the S-shaped curve signal. In the present invention, the focus sensor 7 is structured by the plural sensors for detecting the position in Z-direction of plural detection points $7_1$ to $7_n$, as shown in FIG. 4. Since the sensors are corresponding to the detection points $7_1$ to $7_n$ respectively, they are referred to as the "sensor $7_i$ (i=1 to n)", as needed. The plural sensors $7_1$ to $7_n$ are arranged two dimensionally in the exposure area 6 on the wafer W, and its center is the optical axis direction of the projection light system PL. The plural sensors $7_1$ to $7_n$ detect the plural positions in Z-direction to obtain the approximate plane by using the operation processing such as the least-square method. From the tilt of the approximate plane, the tilt angle ($\theta_X$, $\theta_Y$) of the wafer W surface is also obtained. The detailed structure of the focus sensor is disclosed, for example, Japan laid-open No. H6-283403 and its correspondent, U.S. Pat. No. 5,448,332. The disclosure described in the above is fully incorporated by reference herein, as far as the law of the countries designated in a request or elected in a demand for the application filed in the country of origin permits them.

In the present embodiment, the sensors $7_1$ to $7_n$ are used for detecting the tilt angle and the defocus amount (the position in Z-direction) of the wafer W surface. However, instead of the plural sensors, AF sensors, which has one determination point, might be used. In this case, the leveling sensor with the parallel light beams diagonal incident manner. In the sensor, the parallel light beam is diagonally emitted to the wafer W surface, and the tilt angle of the surface is detected by using the transversal shift amount for the condense position of the reflection light.

In FIG. 1, the main controller system 20 controls the Z-leveling stage 60 (more particularly, three actuators 21A, 22A, and 23A) for driving the substrate table 10, to control the position of the wafer surface based on the measured value from the focus sensor 7.

The substrate table 10 is driven by the above-mentioned actuators 21A, 22A and 23A, and the positions of the supporting points for the substrate table 10 in Z-direction are measured by the encoders 21B, 22B and 23B, which are incorporated into the Z-position driving blocks 21, 22 and 23. The position of the substrate table 10 is defined by the measured values shown as PZ1, PZ2 and PZ3), and X-Y two dimensional coordinate position of the Z-position driving blocks 21, 22, and 23 shown as $(X_1, Y_1), (X_2, Y_2)$ and $(X_3, Y_3)$.

$$\begin{bmatrix} \Theta_X \\ \Theta_Y \\ Z \end{bmatrix} = \begin{bmatrix} X_1 & Y_1 & 1 \\ X_2 & Y_2 & 1 \\ X_3 & Y_3 & 1 \end{bmatrix}^{-1} \cdot \begin{bmatrix} PZ1 \\ PZ2 \\ PZ3 \end{bmatrix} \quad (1)$$

Wherein $\Theta_X$, $\Theta_Y$ and Z are as follows:
$\Theta_X$: tilt in X-direction (tilt around Y-axis)
$\Theta_Y$: tilt in X-direction (tilt around Y-axis)
Z: the position in Z-direction In the coordinate system or the surface of the wafer W by using the focus sensor 7 and that of the substrate table 10 by using the encoder 21B, 22B and 23B, their origins and scales are coincident by the calibration previously preformed.

Figure 5:
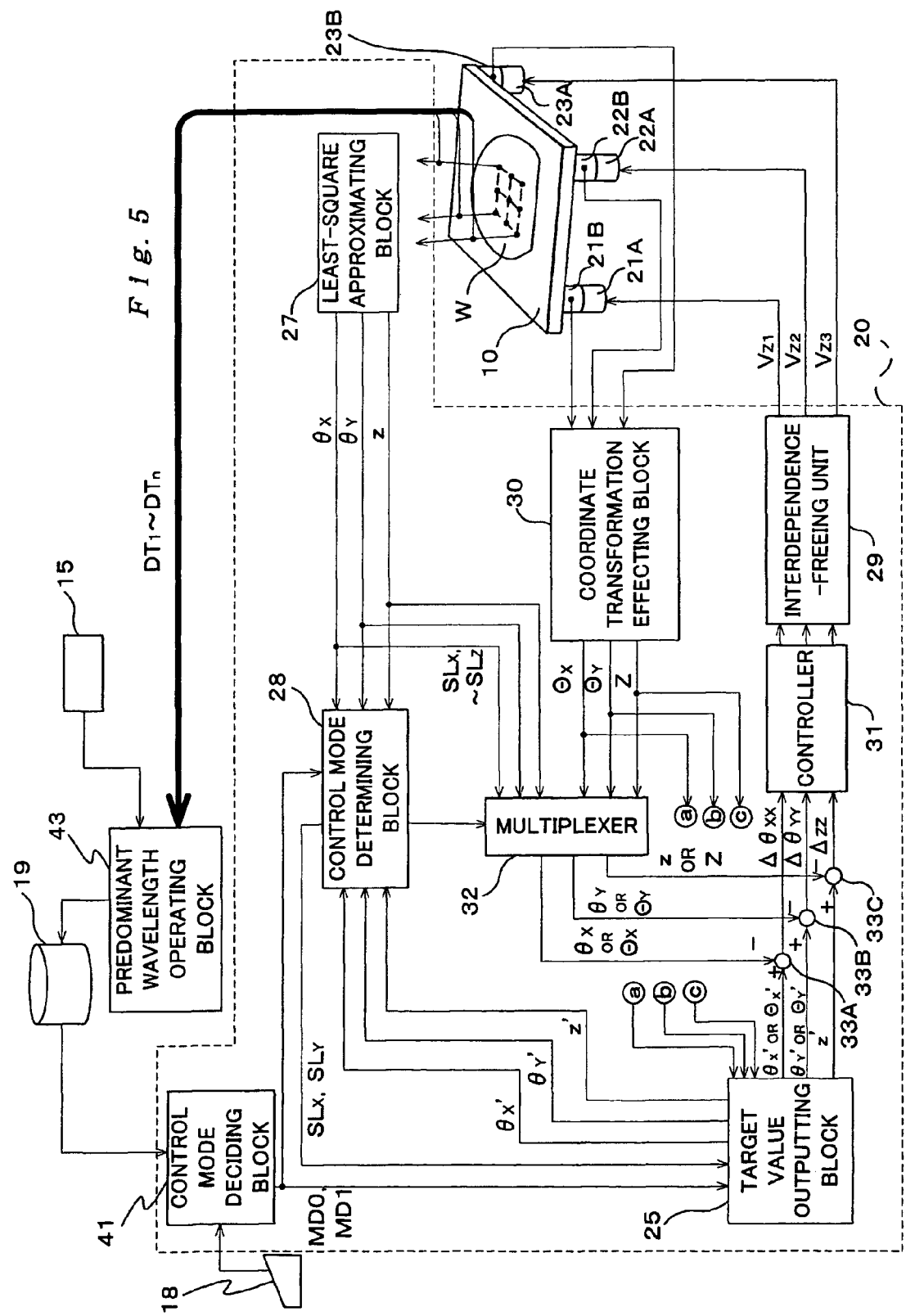
FIG. 5 is a block diagram showing the focus control system of FIG. 1.

In FIG. 5, the structure of the focus control in the present embodiment is shown. In the focus control system comprises: the control mode deciding block 41, the target value outputting block 25, the lest-square approximately block 27, the control mode determining block 28, the interdependence freeing unit 20, the coordinate transformation effecting block 30, the controller 31, the multiplexer 32, three subtractor 33A to 33C, and the predominant wavelength operating block 43, a shown in FIG. 5. The respective blocks are explained hereinafter in detail. The control mode deciding block 41 outputs either "0" and "1" as the mode designation signal MD0 mode to the target value outputting block 25 and the control mode to the target value outputting block 25 and the control mode determining block 28. When the predominant wavelength value $\lambda_0$, which is referred in the exposure to be performed, is stored in the memory unit 19, "0" is out put. When the predominant wavelength value $\lambda_0$ is not stored in the memory unit 19, "1" is output. Furthermore, the control mode deciding block 41 out put either "0" or "1" as the mode designation signal MD1 to the target value outputting block 25 and the control mode determining block 28, based on the predominant wavelength value $\lambda_0$ which is stored in the memory unit 19 and the width value $L_0$ of the exposure area 6 in Y-direction which is input from the I/O unit 18.

When the $\lambda_0 > L_0$, "0" is output as the mode designation signal MD1.

When the $\lambda_0 < L_0$, "1" is output as the mode designation signal MD1. As the width value $L_0$ of the exposure area 6 in Y-direction, the stored value in the memory unit 19 might be used, until it is once input from the I/O unit 18 to be stored in the memory unit 19 and it is again input from the I/O unit 18.

The target data outputting block 25 always transmits the first target value in Z-direction z', the first target value for the tilt in X-direction (the tilt around Y-axis) $\theta_X'$, and the second target value for the tilt in Y-direction (the tilt around X-axis) $\theta_Y'$. The target data outputting block 25 also outputs the first target value in Z-direction position z' as a target value for the positional control by the controller 31, when (0, 0) is input as the mode designation signal (MD0, MD1).

Simultaneously, depending to the result of the control mode determining mentioned hereinbelow, the target data outputting block 25 outputs the first target value of the tilt in X-direction (the tilt around Y-axis) $\theta_X'$ or the second target value $\Theta_X'$, and first target value of the tilt in Y-direction (the tilt around X-axis) $\theta_Y'$ or the second target data $\Theta_Y'$ as the target value for the positional control to be performed by the controller 31. Wherein, the first target value of the tilt in X-direction (the tilt around Y-axis) $\theta_X'$, and first target value of the tilt in Y-direction (the tilt around X-axis) $\theta_Y'$ are inherent target value for the focus control obtained by the calibration such as proof prints of the image plane of the projection optical system PL. The second target data $\Theta_X'$ and $\Theta_Y'$ are set value for convenience to maintain the tilt in X-direction (the tilt around Y-axis) and Y-direction (the tilt around X-axis).

The target data outputting block 25 outputs the first target value in Z-direction position z' as a target value for the positional control by the controller 31, when (0, 1) is input as the mode designation signal (MD0, MD1). Simultaneously, depending to the result of the control mode determining mentioned hereinafter, the target data outputting block 25 outputs the first target value of the tilt in X-direction (the tilt around Y-axis) $\theta_X'$ or the second target value $\Theta_X'$, and first target value of the tilt in Y-direction (the tilt around X-axis) $\theta_Y'$ or the second target data $\Theta_Y'$ as the target value for the positional control to be performed by the controller 31.

As described above, when the mode designation signal MD0 is "0", the tilt of the substrate table 10 immediately before switching the control mode is used as the second target position $\Theta_X'$ and $\Theta_Y'$.

The target data outputting block 25 outputs the second target value in Z-direction position, z' as the target value for the positional control by the controller 31, when (1, 0) is input as the mode designation signal (MD0, MD1). Simultaneously, the target data outputting block 25 outputs the second target value of the tilt in X-direction (the tilt around Y-axis) $\Theta_X'$, and second target value of the tilt in Y-direction (the tilt around X-axis) $\Theta_Y'$ as the target value for the positional control to be performed by the controller 31.

As described above, when the mode designation signal MD1 is "1", the certain value at which the substrate table 10 is horizontal is used as the second target position Z', $\Theta_X$, and $\Theta_Y$.

The least-square approximating block 27 performs the plane approximation the detected signals of the wafer W surface position in Z-direction detected by the respective sensor $7_1$ to $7_n$ which are comprising the focus sensor 7 to obtain three components z, $\theta_X$ and $\theta_Y$. The component z shows the wafer W surface position on the optical axis AX of the projection detecting system PL in Z-direction, $\theta_X$ shows the tilt in X-direction (the tilt around Y-axis), and $\theta_Y$ shows the tilt in Y-direction (the tilt around X-axis).

Figure 6:
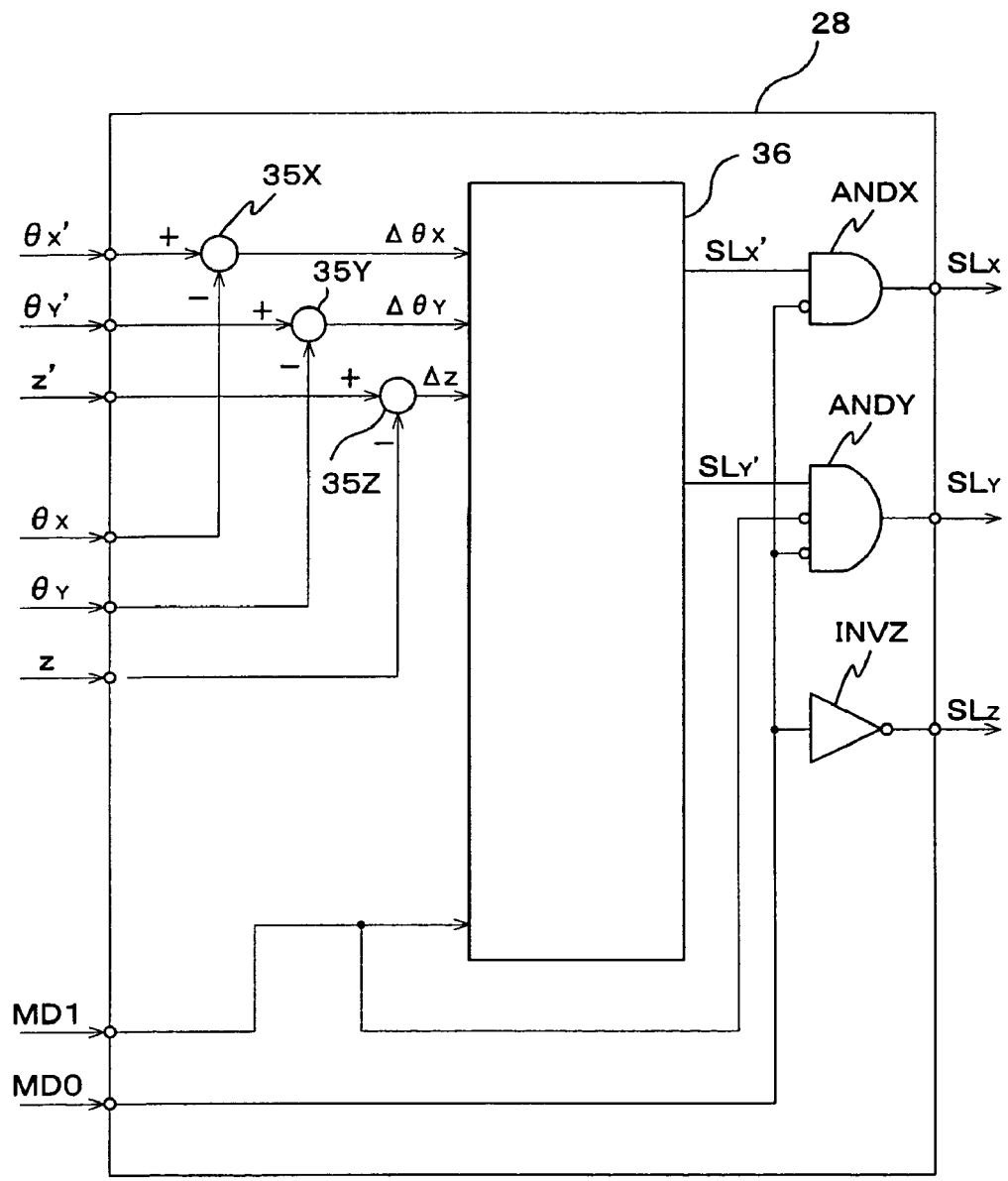
FIG. 6 is a view showing as an example of structure of the control mode deciding block.

As shown in FIG. 6, the control mode determining block 28 comprises the subtractors, 35X, 35Y, and 35Z, the determination processing block 36, and the logical processing circuit ANDX, ANDY and INVZ. The subtractors operate the deviation ($\Delta z$, $\Delta\theta_X$, and $\Delta\theta_Y$) between the target value z', $\theta_X'$, and $\theta_Y'$ obtained from the target data outputting block 25 and the current information z, $\theta_X$, and $\theta_Y$ obtained from the least-square approximation block 27. The determination processing block 36 for performing the determination processing of the control mode described hereinafter by using the deviation ($\Delta z$, $\Delta\theta_X$, and $\Delta\theta_Y$) and the value of the mode designation signal (MD0, MD1). The logical operation circuits output the control designation signals $SL_X$, $SL_Y$, and $SL_Z$. The control designation signals $SL_X$ and $SL_Y$, are output to both the target data outputting block 25 and the multiplexer 32, and the control designation signals $SL_Z$ is output to the multiplexer 32.

From the logical operation unit ANDX, when the mode designation signal MD0 is "0", the operation result $SL_X'$ which is output from the determination processing block 36 is output as the control designation signal $SL_X$. When the mode designation signal MD0 is "1", "0" is output as the designation signal $SL_X$. From the logical operation unit ANDY, when the mode designation signal (MD0, MD1) is (0, 0), the operation result $SL_Y'$ which is output from the determination processing block 36 is output as the control designation signal $SL_Y$. When the mode designation signal (MD0, MD1) is not (0, 0), "0" is output as the designation signal $SL_Y$. From the logical operation unit INVZ, the inverted signal of the mode designation signal MD0 is output as the $SL_Z$.

In order to structure the control mode determining block 28, n FIG. 6, the logical operation circuits, ANDX, ANDY, and INVZ are arranged on the last step of the output for the control designation signals $SL_X$, $SL_Y$ and $SL_Z$. However, another structure might be employed. For example, the deviation ($\Delta z$, $\Delta \theta_X$, and $\Delta \theta_Y$) and the mode designation signal (MD0, MD1) are input into the determining processing block 36, which performs the operation so that the output value is almost the same as $SL_X$, $SL_Y$ and $SL_Z$.

A coordinate transformation effecting block 30 performs the coordinate transformation of the measured values, PZ1, PZ2, and PZ3 into Z for the position in Z-direction, the tilt in X-direction (the tilt around Y-axis), and the tilt in Y-direction (the tilt around X-axis) according to the equation (1) to output the multiplexer 32 and the target data outputting block 25. Wherein, PZ1 to PZ3 are obtained by using the encoders 21B, 22B and 23B, which are respectively incorporated in three Z-position driving blocks 21, 22 and 23.

The subtractors 33A to 33C respectively obtain the position deviation in Z-direction $\Delta zz$, the tilt deviation in X-direction (the tilt around Y-axis) $\Delta \theta_{XX}$, the tilt deviation in Y-direction (the tilt around X-axis) $\Delta \theta_{YY}$. Wherein, the deviation $\Delta zz$ represents the difference between the target value z' (or Z') from the target data outputting block 25 and the actual value z (or Z). The deviation $\Delta \theta_{XX}$ represents the difference between the target value $\theta_X'$ (or $\Theta_X'$) from the target data outputting block 25 and the actual value $\theta_X$ (or $\Theta_X$) output from the multiplexer 32. The deviation $\Delta \theta_{YY}$ represents the difference between the target value $\theta_Y'$ (or $\Theta_Y'$) from the target data outputting block 25 and the actual value $\theta_Y$ (or $\Theta_Y$) output from the multiplexer 32.

The above-mentioned controller 31 is a controller for the positional control loop, and it comprises PID control unit, which performs P action, PI action, or PID action by using the above-mentioned position deviation, the position deviation in Z-direction $\Delta zz$, the tilt deviation in X-direction (the tilt around Y-axis) $\Delta \theta_{XX}$, and the tilt deviation in Y-direction (the tilt around X-axis) $\Delta \theta_{YY}$, are used as the action signals. This controller 31 gives the gained deviation $\Delta zz$, $\Delta \theta_{XX}$, and $\Delta \theta_{YY}$, as velocity instruction to the actuators, 21A, 22A and 23A.

The above-mentioned interdependence freeing unit 29 depends on the linearity, however, by inserting this into the servo loop, three components such as the component in Z-direction and the components in tilt direction around X- or Y-axis might be independently controlled. The interdependence freeing unit 29 performs the interdependence freeing operation for distributing the given velocity instruction as three components in the tilt around X- and Y-axis, and the position in Z-direction by using the X-Y two dimensional coordinate value of the current position for the respective Z-position driving block. Then, it actually outputs the operation result to the actuators 21A, 22A and 23A.

The above-mentioned multiplexer 32 outputs either the set of three components of the current value (z, $\theta_X$, $\theta_Y$) from the least-square approximation block 27 or those of the current value (Z, $\Theta_X$, $\Theta_Y$), depending on the control mode designation signal $SL_X$, $SL_Y$, and $SL_Z$. In the multiplexer 32, when the respective control mode designation signal, $SL_X$, $SL_Y$, and $SL_Z$ is "1", the current value is output from the least-square approximation block 27. On the contrary, when the respective control mode designation signal, $SL_X$, $SL_Y$, and $SL_Z$ is "0", the current value from the coordinate transformation effecting potion 30.

According to the above-mentioned structure, the focusing control is carried out in the first focusing control mode, when the mode designation signal (MD0, MD1) is (0, 0). In the first mode of the focusing control, the main control system 20 follows-up the changes of the three component value (z, $\theta_X$, $\theta_Y$) from the least-square approximation block 27 generated during the synchronous movement to the utmost. In the focus control system, the focusing control is carried out in the second focusing control mode, when the mode designation signal (MD0, MD1) is (0, 1). In the second mode of the focusing control, the main control system 20 follows-up the changes of the two component value (z, $\theta_X$) from the least-square approximation block 27 generated during the synchronous movement to the utmost, but it does not follow-up the change of the component ($\theta_Y$). Furthermore, in the focus control system, the focusing control is carried out in the third focusing control mode, when the mode designation signal (MD0, MD1) is (1, 0). In the third mode of the focusing control, the main control system 20 does not follow-up the changes of the component value (z, $\theta_X$, $\theta_Y$) from the least-square approximation block 27 while they are synchronously moved.

The above-mentioned three shafts actuators, 21A to 23A have the velocity minor loops (the current minor loop), and allow the Z-position driving blocks 21, 22, and 23 to follow-up the given velocity instruction by using the built-in velocity detector (the tacho generator) with the servo control. That is, the Z-position driving blocks 21, 22 and 23 are structured as the subunit controlled by using the velocity loop in which the built-in tacho generators in the actuators 21A, 22A and 23A are used as the velocity sensors. Therefore, the Z-position driving block might track according to the given velocity instruction.

The above-mentioned predominant wavelength operating block 43 acquires the data $DT_1$ to $DT_n$, and obtain the predominant wavelength $\lambda_0$ to store it in the memory unit 19. XY positions of the substrate table 10 from the wafer interferometer 15 and positions of the wafer W surface in Z-direction are corresponding, in the data $DT_1$ to $DT_n$.

Figure 7:
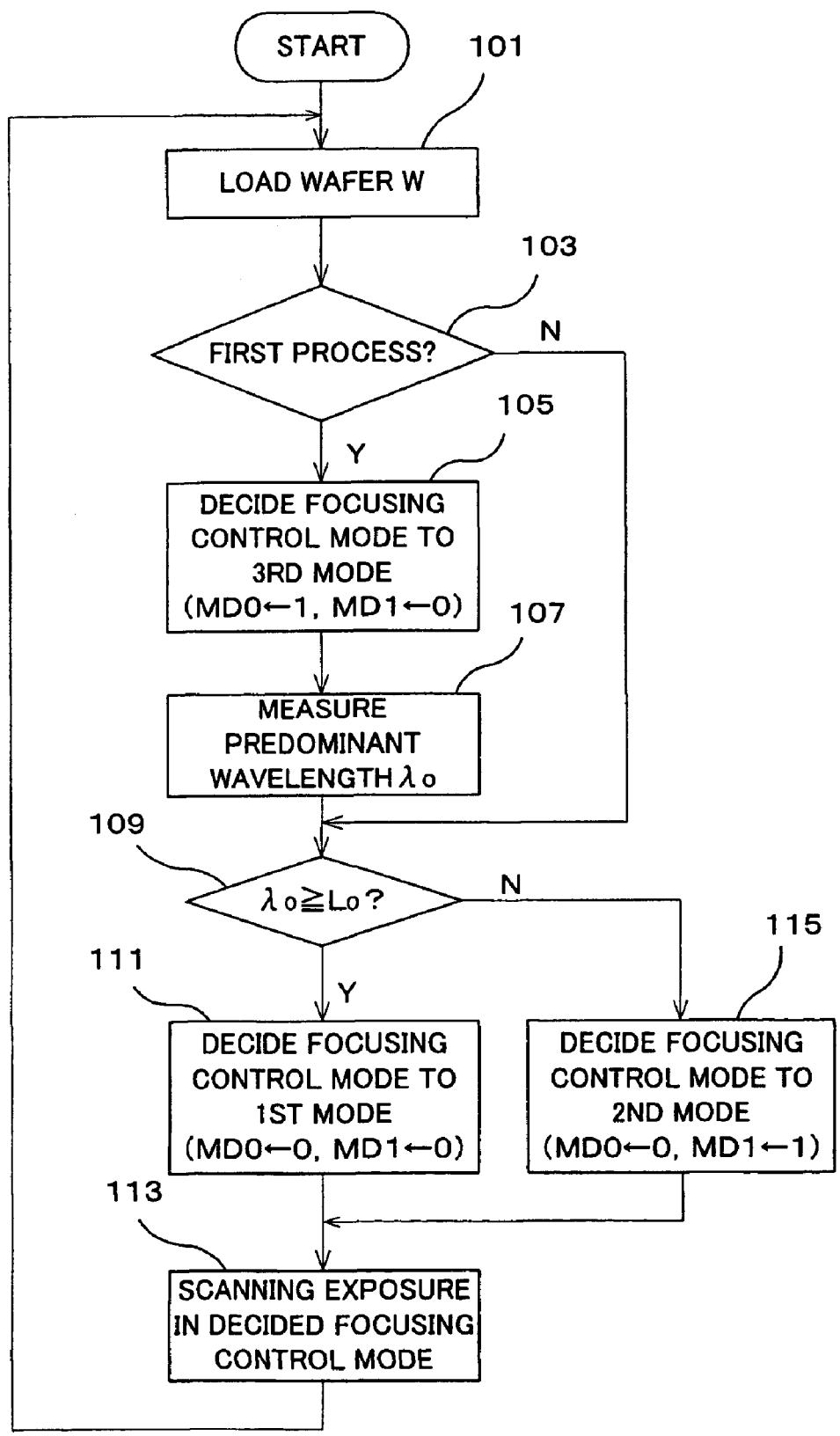
FIG. 7 is a flow chart for explaining the exposure operation.
Figure 8A:
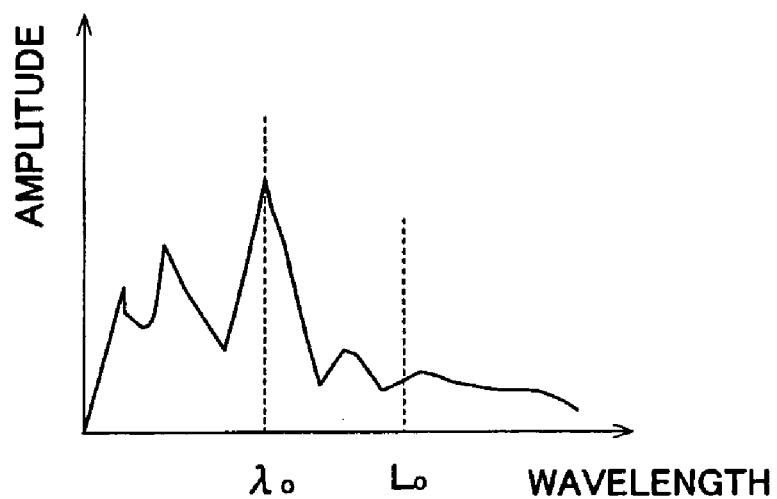
FIGS. 8A and 8B are a view showing the measurement result of the spatial frequency distribution and the preferential wavelength.
Figure 8B:
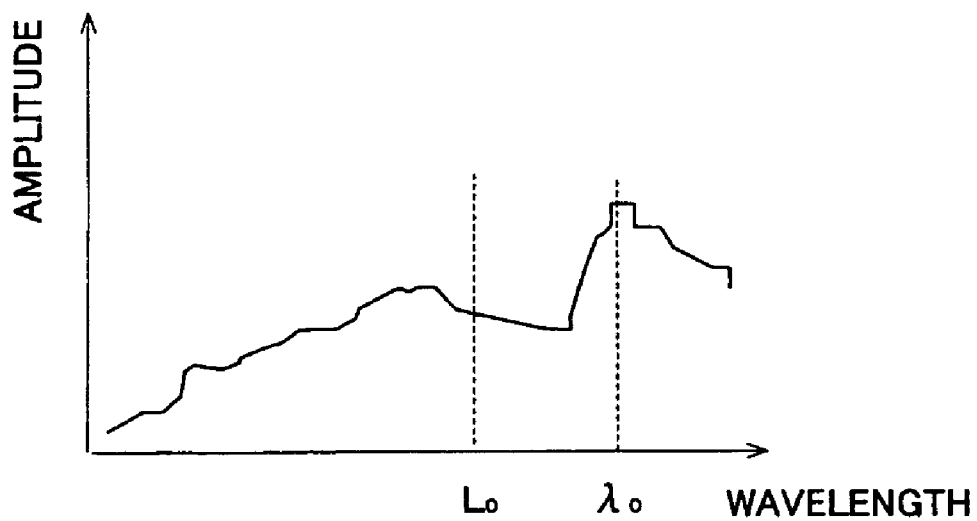
Figure 9A:
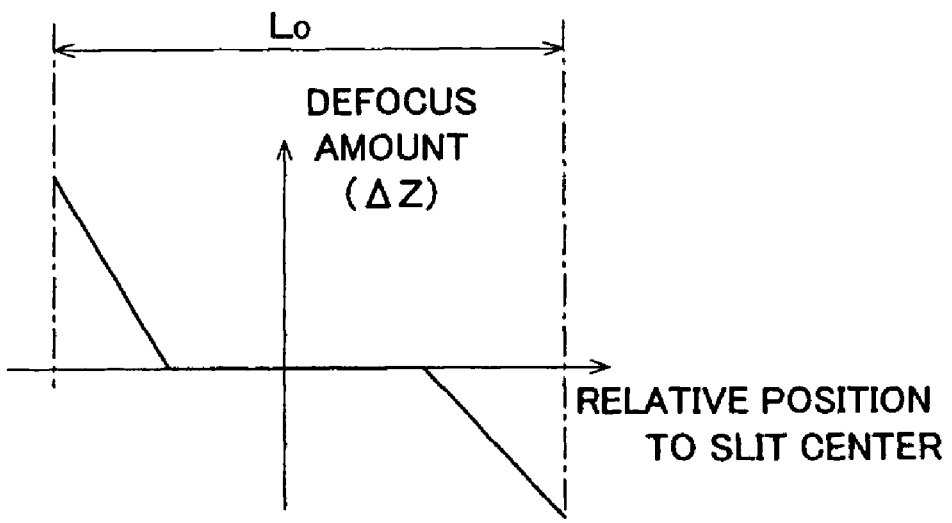
FIGS. 9A and 9B are views for explaining defocus amount at one point on the wafer.
Figure 9B:
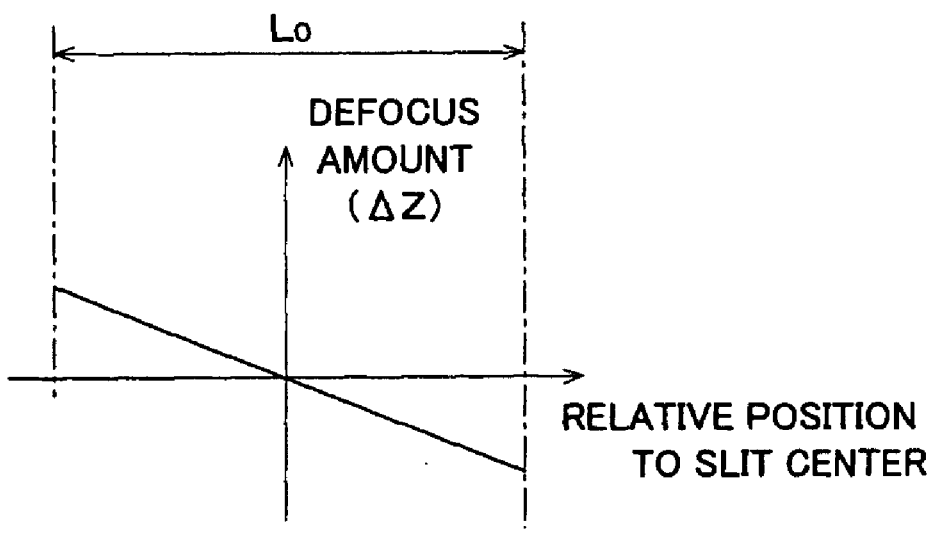

Referring to FIGS. 7 to 9, the exposure procedure of the present invention is explained.

First of al, in step 101 on FIG. 7, the wafer W is loaded on the substrate table 10 by the wafer loader to expose. Subsequently, in step 103, the main control system 20 decides whether it is the first process or not from the point of view of the exposure condition (the process condition) including the pattern formation history on the wafer W, and kinds of the photoresist agents; that is, the predominant frequency $\lambda_0$ as the information for the surface condition of the shot area on the wafer W has been stored in the memory unit 19, prior to the exposure of the wafer. In step 103, when the main control system decides that it is the first process, the procedure goes to step 105 and the control mode deciding block 41 outputs (1, 0) as the mode designation signal (MD0, MD1) to set the focusing mode in the third mode. The target data outputting block 25 inputs the control mode deciding block, and it outputs the certain value for being the surface of the substrate table 10 horizontal as the target positions Z', $\Theta_X'$, $\Theta_Y'$ to the subtractor 33A, 33B and 33C. The control mode determining block 28 outputs (0, 0, 0) as the control mode signal ($SL_X$, $SL_Y$, $SL_Z$), and the multiplexer 32 which received the signal outputs three components of the current value (Z, $\Theta_X'$, $\Theta_Y'$) from the coordinate transformation effecting block 30. Consequently, the focusing control is performed so that the surface of the substrate table 10 is almost horizontal.

Then, in step 107, the information for the surface condition of the shot area on the wafer W, i.e., the predominant frequency $\lambda_0$ is measured. In the measurement, the main control system moves the substrate table 10 for one shot area to the synchronous moving direction (+Y or −Y direction) through the wafer stage driving block 16, maintaining the focusing mode in the third mode, i.e., being the surface of the substrate table 10 horizontal. In the present embodiment, the movement of the substrate table 10 is similarly controlled by the main control system 20 except it instructs to the illumination system which is not shown not so as to emit the illumination light for the exposure. That is, the shot area on the wafer W is moved against the exposure area 6 (the plural detection points for the focus sensor 7) in the condition without exposing the wafer W. The movement might be the moving manner different from the synchronous moving in the scanning exposure.

During this movement, the predominant wavelength operating block 43 acquires the data, in which XY positions of the substrate table 10 from the wafer interferometer 15 is corresponding to positions of the wafer W surface in Z-direction. Then, the predominant wavelength operating block 43 performs the spatial frequency analysis for the synchronous moving direction based on the acquired data to obtain the spatial frequency distribution as the information for the convex and concave of the shot area in the synchronous moving direction. In FIG. 8, examples of the spatial frequency distribution thus obtained are shown. The predominant wavelength $\lambda_0$ corresponds to the predominant frequency is obtained, and the amplitude of the predominant frequency is maximum at the spatial frequency distribution (see FIG. 8). The predominant wavelength operating block 43 stores the predominant wavelength $\lambda_0$ thus obtained and the process condition into the memory unit.

As mentioned above, when the measurement of the predominant wavelength $\lambda_0$ is completed. Then the procedure goes to step 109. In the above-mentioned step 103, when the main controller decides that it is not the first step, the procedure goes to directly step 109, skipping steps 105 and 107.

In step 109, the control mode deciding block 41 compares the predominant wavelength $\lambda_0$ stored in the memory unit 19 and the width of the exposure area 6 inputted from the I/O unit 18; then, it decides whether the tilt of the wafer W in Y-direction (the scanning direction) is controlled or not based on the result from the focus sensor 7, or not. That is, during the synchronous moving, the main control system decides whether the tilt of the wafer W in Y-direction is adjusted by following-up the change between the tilt for the wafer W surface in Y-direction obtained from the detection result by the focus sensor 7 and that of the target data, or not.

Comparing the predominant wavelength $\lambda_0$ to the width $L_0$, and the result is $$\lambda_0 > L_0$$

the control mode deciding block 41 decides that the focusing control mode to be used in the exposure to be performed from now is the first mode, and (0, 0) is output as the mode designation signal (MD0, MD1).

Then, in step 113, fundamentally, the main control system 20 moves synchronously both the reticle R and the wafer W, performing the focusing control in the first mode. After that, the pattern formed on the reticle R is sequentially transferred onto the respective shot area on the wafer W. That is, during the scanning exposure, the position of the wafer W surface in Z-direction, the tilt of the wafer W in X-direction and in Y-direction are controlled, following-up the change of the difference between the target value and the measurement value which is obtained from the detection result using the focus sensor 7. According to this, the positioning of the image plane of the projection optical system PL and the exposure plane on the wafer W is precisely performed in the exposure area 6, and the image of the reticle R is projected on the wafer W.

In the focusing control by using the first mode, the main control system 20 performs the focusing control which tracks the change during the synchronous moving of the three components of the current value (z, $\theta_X$, $\theta_Y$) from the least-square approximation block 27. However, in the present embodiment, considering the limit of the driving capacity, i.e., the driving velocity, of the actuators 21A, 22A and 23A, the focusing control, for example, disclosed in Japan laid-open No. H9-82636 and its correspondent, U.S. Pat. No. 5,737,063. The disclosure described in the above is fully incorporated by reference herein, as far as the law of the countries designated in a request or elected in a demand for the application filed in the country of origin permits them.

This focusing control is explained briefly. During synchronously moving, the focusing control is performed under the condition that the control mode determining block 28 sets the data (z', $\theta_X'$, $\theta_Y'$) as the following-up control target value and sets the value (z, $\theta_X$, $\theta_Y$) as the following-up control current value, the main control system 20 decides that one of the velocity instruction values $Vz_1$, $Vz_2$, and $Vz_3$, those which are output from the interdependence freeing unit 29, over the maximum value of the driving velocity for the actuators 21A, 22A, and 23A (the first condition) or not. When the positive decision for the first condition is made, the value (1, 1, 1) is output as the control mode designation signal ($SL_X$, $SL_Y$, $SL_Z$). Then, the target data outputting block 25 outputs the value (z', $\theta_X'$, $\theta_Y'$) as the target focusing control signal into the subtractors 33A, 33B, and 33C. Alternatively, the multiplexer 32 outputs the three components of the current value (z, $\theta_X$, $\theta_Y$) from the least-square approximation block 27 into the subtractors 33A, 33B, and 33C. As a result, the focusing control is performed under the first control condition, i.e., the change during the synchronous moving of the three components for the current value (z, $\theta_X$, $\theta_Y$) from the least-square approximation block 27 is tracked.

When the negative decision for the first condition is made, the focusing control is performed under the condition that the control mode determining block 28 sets the value (z', $\theta_X'$) as the following-up control target value and sets the value (z, $\theta_X$) as the following-up control current value. The main control system 20 decides that one of the velocity instruction values $Vz_1$, $Vz_2$, and $Vz_3$, those which are output from the interdependence freeing unit 29, over the maximum value of the driving velocity for the actuators 21A, 22A, and 23A (the second condition) or not. When the positive decision for the first condition is made, the value (1, 0, 1) is output as the control mode designation signal ($SL_X$, $SL_Y$, $SL_Z$). Then, the target data outputting block 25 outputs the value (z', $\theta_X'$, $\Theta_Y'$) as the target focusing control signal into the subtractors 33A, 33B, and 33C. Alternatively, the multiplexer 32 outputs the three components of the current value (z, $\theta_X$, $\Theta_Y$) from the least-square approximation block 27 into the subtractors 33A, 33B, and 33C. Wherein, the target data outputting block 25 outputs the tilt of the substrate table 10 in Y-direction just prior to switch the control as the target value ($\Theta_Y'$). As a result, the focusing control is performed under the second control condition, i.e., the change during the synchronous moving of the two components for the current value (z, $\theta_X$) from the least-square approximation block 27 is tracked.

When the negative decision for the second condition is made, the focusing control is performed under the condition that the control mode determining block 28 sets the value (z', $\theta_Y'$) as the following-up control target value and sets the value (z, $\theta_Y$) as the following-up control current value (the third control condition). The main control system 20 decides that one of the velocity instruction values $Vz_1$, $Vz_2$, and $Vz_3$, those which are output from the interdependence freeing unit 29, over the maximum value of the driving velocity for the actuators 21A, 22A, and 23A (the third condition) or not. When the positive decision for the first condition is made, the value (0, 1, 1) is output as the control mode designation signal ($SL_X$, $SL_Y$, $SL_Z$). Then, the target data outputting block 25 outputs the value (z', $\Theta_X'$, $\theta_Y'$) as the target focusing control signal into the subtractors 33A, 33B, and 33C. Alternatively, the multiplexer 32 outputs the three components of the current value (z, $\Theta_X$, $\theta_Y$) from the least-square approximation block 27 into the subtractors 33A, 33B, and 33C. Wherein, the target data outputting block 25 outputs the tilt of the substrate table 10 in Y-direction just prior to switch the control as the target value ($\Theta_X'$). As a result, the focusing control is performed under the third control condition, i.e., the change during the synchronous moving of the two components for the current value (z, $\theta_Y$) from the least-square approximation block 27 is tracked.

When the negative decision for the third condition is made, the control mode determining block 28 outputs the value (0, 0, 1) as the control mode designation signal ($SL_X$, $SL_Y$, $SL_Z$). Then, the target data outputting block 25 outputs the value (z', $\Theta_X'$, $\Theta_Y'$) as the target focusing control signal into the subtractors 33A, 33B, and 33C, and the multiplexer 32 outputs the three components of the current value (z, $\Theta_X$, $\Theta_Y$) from the least-square approximation block 27 into the subtractors. Wherein, the target data outputting block 25 outputs the tilt of the substrate table 10 in X- and Y-direction just prior to switch the control as the target value ($\Theta_X'$, $\Theta_Y'$). As a result, the focusing control is performed under the fourth control condition for holding the posture of the tilt in X- and Y-direction just prior to switch the control mode, independent of the surface condition of the wafer.

On the contrary, in step 109, when it is decided that $$\lambda_0 < L_0$$

the control mode determining block 41 decides that the focusing mode in the exposure to be performed in future is the second mode, and it outputs the value (0, 1) as the mode designation signal (MD0, MD1) in step 115.

Then, in step 113, fundamentally, the main control system 20 synchronously moves both the reticle R and the wafer W, performing the focusing control in the second mode. Then, the pattern formed on the reticle R is sequentially transferred onto the respective shot area on the wafer W. That is, during the scanning exposure, the position of the wafer W surface in Z-direction, the tilt of the wafer W in X-direction are controlled, following-up the change of the difference between the target value and the measurement value which is obtained from the detection result by using the focus sensor 7. Alternatively, the tilt of the wafer W in Y-direction is controlled in the predetermined condition based on the measured value by using the encoders 21B, 22B, and 23B, without following-up the change between the target value and the measured value obtained from the focus sensor 7. The tilt of the wafer W in Y-direction might be decided based on the information for the image plane of the projection optical system PL or that for the surface condition (the convex and concave condition) of the shot area on the wafer W obtained in the above-mentioned step 107.

In the focusing control by using the second mode, in the same manner as the first mode, the focusing control is performed. In the focus control, the change of the two components of the current value (z, $\theta_X$) from the least-square approximation block 27 during the synchronous moving is tracked. However, in the present embodiment, the focusing control is performed in the same manner as the first mode, considering the limit of the driving capacity (driving velocity) for the actuators 21A, 22A and 23A.

During synchronously moving, the focusing control is performed under the condition that the control mode determining block 28 sets the value (z', $\theta_X'$) as the following-up control target value. Then, the main control system 20 decides that one of the velocity instruction values $Vz_1$, $Vz_2$, and $Vz_3$, those which are output from the interdependence freeing unit 29, over the maximum value of the driving velocity for the actuators 21A, 22A, and 23A (the above-mentioned second condition) or not. When the positive decision for the condition is made, the value (1, 0, 1) is output as the control mode designation signal ($SL_X$, $SL_Y$, $SL_Z$). Consequently, the focusing control is performed in the focusing control mode.

When the negative decision is made for the second mode, the control mode deciding block 28 outputs the value (0, 0, 1) as the control mode designation signal ($SL_X$, $SL_Y$, $SL_Z$). Consequently, the focusing control is performed in the above-mentioned fourth control mode.

As mentioned above, in step 113, when the focusing control mode is the first mode or the second mode, the focus control is performed in the range in which the leveling following-up can be practicable in the view point of the performance for the apparatus; thereby the defocus against the entire exposure area, and the scanning exposure is performed maximizing the focal depth in the projection optical system. Then, even if the leveling following-up is not practicable by the performance of the apparatus, the scanning exposure is performed, conducting the focusing control without serious failure of the control or the generation of the fatal defocus amount. The pattern formed on the reticle is thus transferred onto the respective shot areas on the wafer W.

Thus, when the transfer of the pattern onto the wafer W is completed in step 113, the procedure goes to step 101. Then, the exposure procedure is performed as the same manner as described above.

As explained hereinbefore, in the present embodiment, the different focusing control is performed, depending on the surface condition of the shot area as the divided area which is defined based on that the predominant wavelength is equal to or wider than the slit width of the exposure area on the wafer W. The predominant wavelength is obtained from the spatial frequency components for which the concave or convex exist inside the shot area, and they are on the synchronously moving direction. When the predominant wavelength is equal to or wider than the slit width of the exposure area on the wafer W, the main control system 20 tracks the synchronously moving of the wafer and performs the focusing control including the leveling control for the synchronously moving direction of the wafer. When the predominant wavelength is shorter, the main control system 20 tracks the synchronously moving of the wafer and performs the focusing control except the leveling control for the synchronously moving direction of the wafer. Accordingly, the pattern might be transferred without serious deterioration of the imaging performance, performing the focusing control by using the simple structure that is not premising the high focusing driving practicability.

The scanning type exposure apparatus of the present invention detects the tilt against the horizontal plane; then, based on the detection result, it detects the detection result data obtained from the focus detecting system while the substrate table is moved in the same manner as the synchronously moving, maintaining the substrate table is almost horizontal. After that, the predominant wavelength of the shot area is obtained by using the acquisited data. Accordingly, since one sensor might be used as the measurement sensor for the predominant wavelength and that for the focus position in the synchronously moving, it is not necessary to correct the difference derived from sensors type and so forth.

In the present embodiment, the predominant wavelength is measured, when the main control system 20 decides that it is the first process from the point of view of the exposure condition (the process condition) including the pattern formation history on the wafer W, and kinds of the photoresist agents. When the pattern is transferred by the same process, the predominant wavelength previously measured is used, so that high through put might be maintained.

In the present embodiment, when the plural shot areas for exposing under the same condition are formed on the wafer, the predominant wavelength is measured for one of the shot area. Therefore, the through put of the exposure procedure is not decreased.

In the scanning type exposure apparatus 100 of the present embodiment, elements shown in FIG. 1 such as the above-mentioned reticle stage 3, the projection optical system PL, the substrate table 10, X-Y stage 11, the focus sensors 7A and 7B, and the main control system for controlling them are connected electrically, mechanically and optically to assemble the apparatus 100. After that, the apparatus 100 is totally adjusted (electrical adjustment or inspection of the operation) to produce the exposure apparatus 100. The production of the exposure apparatus 100 is preferably produced in a clean room in which temperature and cleanliness of the air are controlled.

An embodiment of a device manufacturing method by using the exposure apparatus and method above will be described.

Figure 10:
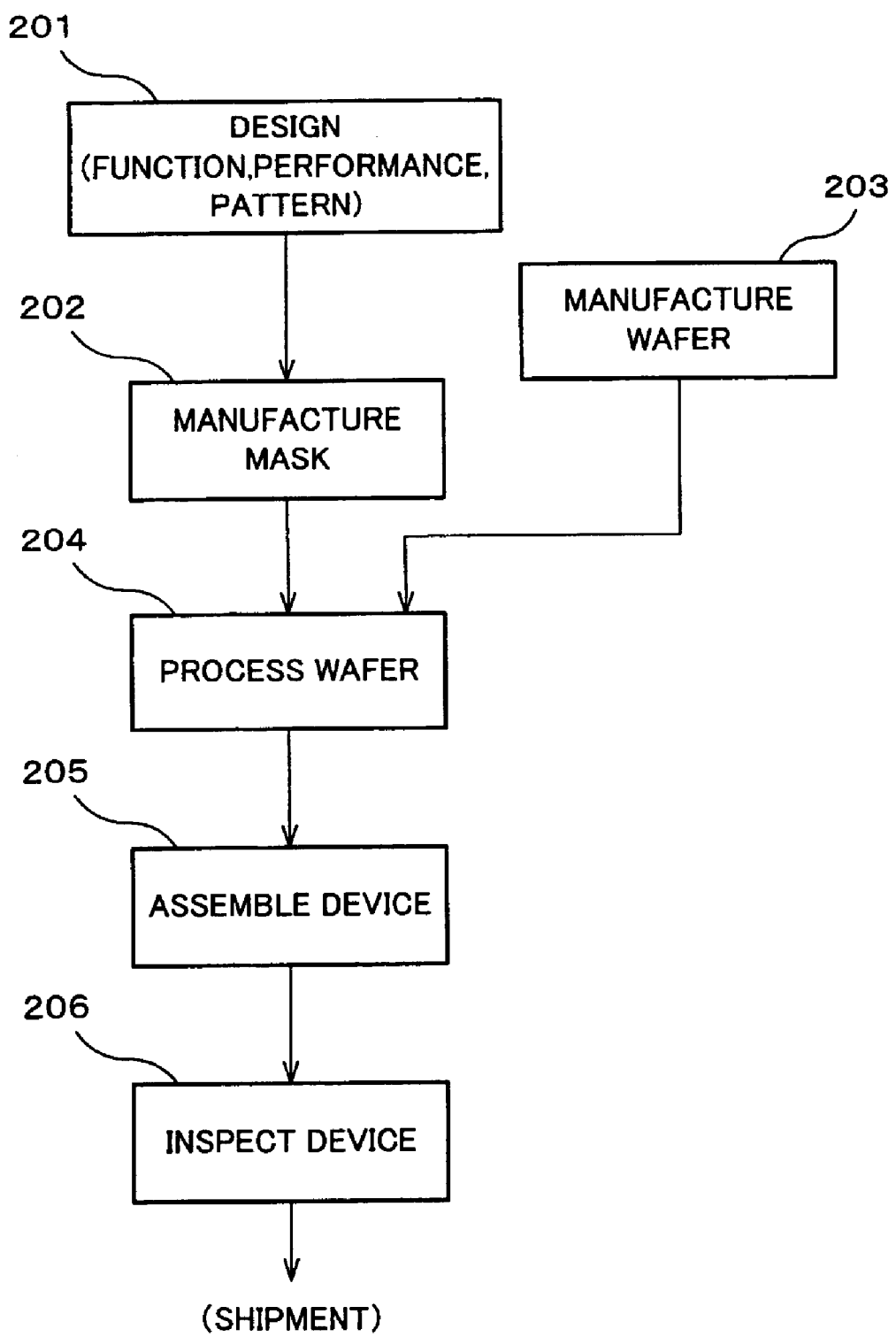
FIG. 10 is a flow chart for explaining the device manufacturing method by using the exposure apparatus shown in FIG. 1.

FIG. 10 is a flow chart showing an example of manufacturing a device (a semiconductor chip such as an IC, or LSI, a liquid crystal panel, a CCD, a thin film magnetic head, a micromachine, or the like). As shown in FIG. 10, in step 201 (design step), function/performance is designed for a device (e.g., circuit design for a semiconductor device) and a pattern to implement the function is designed. In step 202 (mask manufacturing step), a mask on which the designed circuit pattern is formed is manufactured. In step 203 (wafer manufacturing step), a wafer W is manufacturing by using a silicon material or the like.

In step 204 (wafer processing step), an actual circuit and the like are formed on the wafer W by lithography or the like using the mask and wafer prepared in steps 201 to 203, as will be described later. In step 205 (device assembly step), a device is assembled by using the wafer processed in step 204. Step 205 includes process such as dicing, bonding and packaging (chip encapsulation).

Finally, in step 206 (inspection step), a test on the operation of the device, durability test, and the like are performed. After these steps, the device is completed and shipped out.

Figure 11:
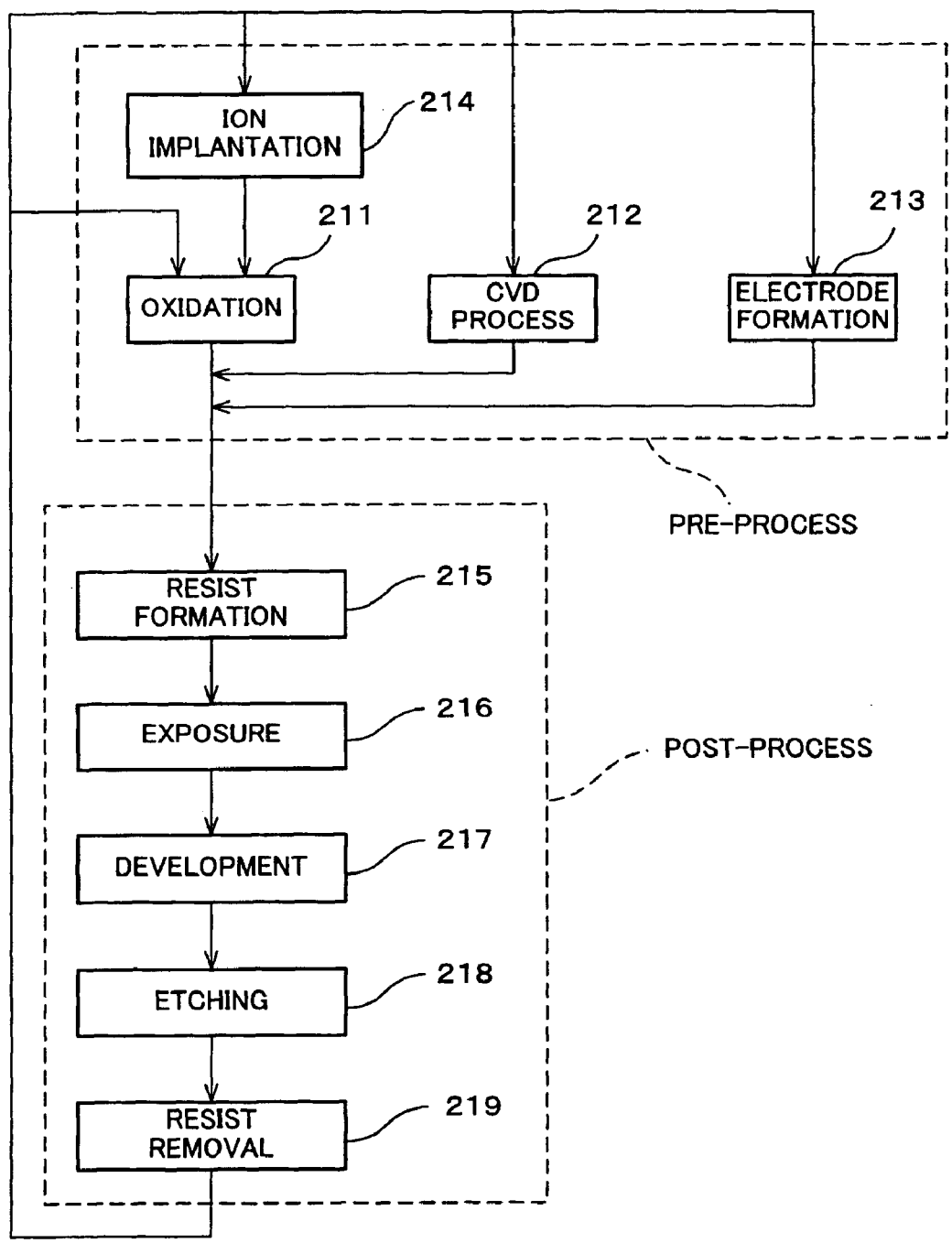
FIG. 11 is a flow chart showing the processing step in FIG. 10.

FIG. 11 is a flow chart showing a detailed example of step 204 described above in manufacturing the semiconductor device. Referring to FIG. 11, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above constitute a pre-process for the respective steps in the wafer process and are selectively executed in accordance with the processing required in the respective steps.

When the above pre-process is completed in the respective steps in the wafer process, a post-process is executed as follows. In this post-process, first, in step 215 (resist formation step), the wafer is coated with a photosensitive agent. Next as, in step 216, the circuit pattern on the mask is transcribed onto the wafer by the above exposure apparatus and method. Then, in step 217 (developing step), the exposed wafer is developed. In step 218 (etching step), and exposed member on a block other than a block where the resist is left is removed by etching. Finally, in step 219 (resist removing step), the unnecessary resist after the etching is removed.

By repeatedly performing these pre-process and post-process, multiple circuit patterns are formed on the wafer.

As described above, the device on which fine patterns are precisely formed is manufactured in enhanced productivity.

In the present embodiment, the predominant wavelength is measured, when the main control system 20 decides that it is the first process from the point of view of the exposure condition (the process condition) including the pattern formation history on the wafer W, and kinds of the photoresist agents. However, the measurement might be performed in the initial of the lot on which the pattern is transferred by the same process. Even in this case, the predominant wavelength is measured for sole wafer per lot. Therefore, the high through put might be maintained.

The predominant wavelength might be obtained by calculating in the lithography process for the wafer W that is previously performed, instead of measuring prior to exposure. In this case, since the measurement time is cut out, the high through put might be maintained.

In the above-mentioned present embodiment, the predominant wavelength and the slit width of the exposure area on the wafer in the synchronously moving direction are compared. However, depending on the characteristics of the photoresist agent used or the minimum line width of the pattern to be transferred, the predominant wavelength and the constant K times value of the above-mentioned slit width might be compared. The constant K is obtained from the experiment, depending on the characteristics of the photoresist agent used or the minimum line width of the pattern to be transferred. In this case, the most suitable focusing control might be performed.

When the plural chip patterns are formed in the shot area, the predominant wavelength might be obtained by measuring the spatial frequency distribution for one chip pattern.

In the present embodiment, when the predominant wavelength is measured, the position of the detection point in Z-direction might be measured, driving the substrate table in the horizontal. However, the positions of the detection points in Z-direction on the substrate are measures, moving the substrate table of which tilt to the horizontal plane is fixed. In this case, after the primary component is deleted from the position data distribution in Z-direction which are acquired in the X-Y plane, the predominant frequency might be obtained in the same manner as the present embodiment, by processing similarly.

Alternatively, in the measurement of the information for the concave and convex on the above-mentioned shot area (the spatial frequency distribution), the throughput is not reduced provided in that the wafer W is moved when the alignment mark formed on the wafer W is measured, wherein the alignment mark is formed for obtaining the arrangement information of the plural shot areas on the wafer W. The detail for the measurement of the alignment mark formed on the wafer W is disclosed, for example, in Japan laid-open No. H06-275496 and its corresponding U.S. patent application Ser. No. 183,879 (filing date: Jan. 21, 1994) and its CIP application Ser. No. 569,400 (filing date: Dec. 8, 1995). The disclosure described in the above is fully incorporated by reference herein, as far as the law of the countries designated in a request or elected in a demand for the application filed in the country of origin permits them.

The information for the convex and concave on the shot area is measured prior to the above-mentioned scanning exposure and it obtained form the focus sensor 7. The information can be used described in below.

(1) The information is used as the information for selecting the detection point to be used in the scanning exposure on the wafer W among the plural detection points of the focus sensor. For example, during the scanning exposure on the wafer W, the detection point existing the position at which a stair having special height difference is formed such as the scribe in the shot area. Thereby, the deterioration of the positioning accuracy between the imaging plane of the projection optical system and the exposure plane of the wafer W is prevented.

(2) The information is used as the information for obtaining the offset amount (the correction data) to correct the detection result from the focus sensor 7, in the scanning exposure. For example, in the case that the stair part having special height difference is formed such as the scribe is existed in the shot area, the detection result from the focus sensor 7 corresponding to the part is corrected by using the offset amount. Thereby, the imaging plane of the projection optical system and the exposure plane of the wafer W is precisely positioned although the stair part having special height difference is existed in the shot area.

INDUSTRIAL APPLICABILITY

As described in detail, according to the scanning exposure method of the present invention, the focusing control of the substrate is performed by using the properly adjusted mode; thereby the pattern formed on the mask is transferred on the substrate without serious deterioration of the imaging performance. Alternatively, according to the scanning exposure apparatus of the present invention, the pattern is transferred by using the scanning exposure method of the present invention; thereby the pattern formed on the mask is transferred on the substrate without serious deterioration of the imaging performance. Accordingly, the scanning exposure method and apparatus are preferably used for the mass production of the device having the fine patterns.

What is claimed is:

1. A scanning exposure method for transferring a pattern formed on a mask to a divided area on a substrate through a projection optical system, and synchronously moving said mask and said substrate with respect to an illumination light along a synchronous moving direction of said substrate, said scanning exposure method comprising the steps of:

determining a spatial frequency distribution of the divided area along said synchronous moving direction of said substrate;

deciding to use either a first focusing control mode providing substrate tilt changing control or a second focusing control mode maintaining substrate tilt unchanged as a decided mode when said pattern is transferred onto the divided area depending on the spatial frequency distribution of the divided area determined by the determining step and a width of an illumination area on the substrate in the synchronous moving direction; and transferring the pattern formed on the mask onto the divided area while performing said focusing control in the decided mode.

2. The scanning exposure method according to claim 1, wherein said first focusing control mode performs a tilt control to change substrate tilt in said synchronous moving direction of said substrate, and said second focusing control mode maintains unchanged substrate tilt in the synchronous moving direction of the substrate.

3. The scanning exposure method according to claim 2, wherein said substrate is controlled by using said first focusing control in said first mode when a predominant wavelength is equal to or longer than a length corresponding to said width of the illumination area in the synchronous moving direction of said substrate, the predominant wavelength corresponding to a predominant frequency that has a maximum amplitude in said spatial frequency distribution; and said substrate is controlled by using said focusing control in said second mode when a predominant wavelength is shorter than the length corresponding to the width of the illumination area in the synchronous moving direction of said substrate.

4. The scanning exposure method according to claim 3, wherein said length corresponding to said width of the illumination area in the synchronous moving direction of said substrate is a slit width.

5. The scanning exposure method according to claim 1, wherein said spatial frequency distribution of said divided area is determined prior to said transfer of said pattern on said mask onto the divided area.

6. The scanning exposure method according to claim 5, wherein said spatial frequency distribution of said divided area is determined in every lot of said substrate on which said pattern formed on said mask is transferred prior to said transfer of the pattern.

7. The scanning exposure method according to claim 5, wherein
said spatial frequency distribution of said divided area is determined in every exposure process of said transfer of said pattern formed on said mask onto said substrate prior to said transfer of the pattern.

8. The scanning exposure method according to claim 5, wherein
a plurality of divided areas are arranged on said substrate; and
said spatial frequency distribution of said divided area is determined by determining the spatial frequency distribution of one of the plurality of divided areas.

9. The scanning exposure method according to claim 1, wherein
a focusing control is provided that includes a focus position control that controls a position of said substrate in an optical axis direction of said projection optical system; and
when it is decided that said focus position control cannot be performed, following said synchronous moving, a control is performed to maintained said substrate at a position just prior to the decision in an optical axis direction of said projection optical system.

10. The scanning exposure method according to claim 1, wherein
a focusing control is provided that includes a tilt control of said substrate in said synchronous moving direction; and
when it is decided that said tilt control cannot be performed, following said synchronous moving, a control is performed to maintain a tilt of the substrate just prior to the decision in said synchronous moving direction.

11. The scanning exposure method according to claim 1, wherein
a focusing control is provided that includes a tilt control of said substrate in a direction perpendicular to said synchronous moving direction and an optical axis direction of said projection optical system; and
when it is decided that said tilt control cannot be performed, following said synchronous moving, a control is performed to maintain a tilt of the substrate just prior to the decision in said direction perpendicular to said synchronous moving direction and said optical axis direction of said projection optical system.

12. The scanning exposure method according to claim 1, wherein said focusing control mode is decided prior to the step of transferring the pattern formed on the mask onto said divided area.

13. A device manufacturing method including a lithographic process, comprising:
transferring a predetermined pattern onto a divided area, which is divided by street lines on a substrate, by using the exposure method according to claim 1.

14. A scanning exposure apparatus which is used to transfer a pattern formed on a mask onto a divided area on a substrate through a projection optical system, and synchronously moving the mask and the substrate with respect to illumination light along a synchronous moving direction of said substrate, said scanning exposure apparatus comprising:
a mask stage which holds the mask;
a substrate stage which holds the substrate;
a first detecting system which detects a position for at least one of detection point in an optical axis direction of said projection optical system, wherein the detection point is in a illumination area on said substrate surface;
a first driving system which drives the mask stage and the substrate stage in planes perpendicular to said optical axis direction of said projection optical system;
a second driving system which drives the substrate stage to at least one of the optical axis direction of the projection detecting system and a tilt direction;
a memory unit which stores a data representing a spatial frequency distribution of said divided area along said synchronous moving direction of said substrate; and
a control system which synchronously moves the mask stage and the substrate stage by controlling the first driving system, while performing said focusing control by controlling the second driving system based on a result from the first detecting system, wherein a focusing control mode to be used in the transfer of a pattern onto said divided area is decided from a plurality of focusing control modes based on the data representing the spatial frequency distribution of the divided area and a width of an illumination area on the substrate in the synchronous moving direction.

15. The scanning exposure apparatus according to claim 14, wherein
said plurality of focusing control modes include a first mode in which a tilt control in a direction of said synchronous moving of said substrate is performed following the synchronous moving, and a second mode in which the tilt control in the direction of the synchronous moving of the substrate is not performed following the synchronous moving.

16. The scanning exposure apparatus according to claim 15, further comprising a second detecting system which detects a tilt of said substrate stage in said synchronous moving direction to a virtual plane perpendicular to said optical axis direction of said projection optical system and in a direction perpendicular to the said synchronous moving direction; and
said control system performs said focusing control based on detection results from said first and second detecting systems.

17. The scanning exposure apparatus according to claim 16, wherein said plurality of focusing control modes further include a third mode which maintains said surface of said substrate stage in parallel with said virtual plane based on a detection result from said second detecting system, and
said exposure apparatus further comprises a calculating operation unit which acquires detection result data by using said first detecting system during said synchronous moving under the focusing control in said third mode, and the exposure apparatus obtains said spatial frequency distribution of said divided area based on the detection result data.

18. The scanning exposure apparatus according to claim 17, wherein
said calculating operation unit calculates said spatial frequency distribution formed by concave and convex substrate parts forming a repeating unit area of said pattern to be transferred in said divided area along said synchronous moving direction of said substrate, wherein the concave and convex substrate parts are further formed to be convex and concave in said optical axis direction of said projection optical system; and
then the calculating operation unit obtains a predominant wavelength corresponding to a predominant frequency which is maximal in the spatial frequency distribution to store in said memory unit as said data.

19. The scanning exposure apparatus according to claim 14, wherein said control system decides said focusing control mode prior to the transfer of the pattern onto said divided area.

20. A device manufactured by using said exposure apparatus according to claim 14.

21. A making method of a scanning exposure apparatus that transfers a pattern formed on a mask onto a divided area on a substrate through a projection optical system, while moving said mask and said substrate synchronously with respect to an illumination light along a synchronous moving direction of said substrate, said making method comprising:

providing a mask stage that holds said mask;

providing a substrate stage that holds the substrate;

providing a first detecting system that detects a position in an optical axis direction of said projection optical system of at least one detection point within an illumination area on a surface of said substrate;

providing a first driving system that drives the mask stage and the substrate stage in a plane perpendicular to said optical axis direction;

providing a second driving system that drives the substrate stage in at least one of the optical axis direction and a tilt direction;

providing a memory unit that stores data representing a spatial frequency distribution of said divided area along said synchronous moving direction of said substrate; and providing a control system that obtains the spatial frequency distribution of the divided area, decides a focusing control mode to be used when transferring the pattern onto said divided area as being either a first focusing control mode or a second focusing control mode based on the obtained data representing the spatial frequency distribution of the divided area and a width of an illumination area on the substrate in the synchronous moving direction, and performs said decided focusing control mode by controlling the second driving system based on a detection result from the first detecting system, while synchronously moving the mask stage and the substrate stage by controlling the first driving system, wherein the first focusing control mode performs a tilt control of the substrate while said pattern is transferred onto the divided area and the second focusing control mode maintains a tilt of the substrate while said pattern is transferred onto the divided area.

22. The making method according to claim 21, further comprising:

providing a second detecting system that detects a tilt of said substrate stage in said synchronous moving direction and in a direction perpendicular to said synchronous moving direction, in respect to a virtual plane perpendicular to said optical axis direction of said projection optical system.

23. The making method according to claim 22, further comprising:

providing a calculating operation unit that acquires detection result data from said first detecting system during said synchronous moving under a focusing control that maintains a surface of said substrate stage to be substantially parallel to said virtual plane based on a detection result from said second detecting system, and obtains said spatial frequency distribution of said divided area based on said detection result data.

24. The scanning exposure apparatus according to claim 21, wherein said control system decides said focusing control mode prior to the transfer of the pattern onto said divided area.

* * * * *